(12) United States Patent
Ahn et al.

(10) Patent No.: US 10,522,780 B2
(45) Date of Patent: Dec. 31, 2019

(54) ORGANIC LIGHT EMITTING DISPLAY DEVICE

(71) Applicant: Samsung Display Co., Ltd., Yongin-si, Gyeonggi-do (KR)

(72) Inventors: Kiwan Ahn, Seoul (KR); Joosun Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/787,629

(22) Filed: Oct. 18, 2017

(65) Prior Publication Data

US 2018/0108859 A1   Apr. 19, 2018

(30) Foreign Application Priority Data

Oct. 19, 2016   (KR) .................. 10-2016-0135727

(51) Int. Cl.
  *H01L 51/52*   (2006.01)
  *H01L 27/32*   (2006.01)
(52) U.S. Cl.
  CPC ........ *H01L 51/5203* (2013.01); *H01L 27/322* (2013.01); *H01L 27/3262* (2013.01); *H01L 27/3276* (2013.01); *H01L 2227/323* (2013.01)
(58) Field of Classification Search
  CPC .............. H01L 27/322; H01L 27/3276; H01L 27/3248; H01L 27/3246; H01L 51/5237; H01L 51/5203; H01L 51/56; H01L 29/4908; H01L 27/1248; H01L 27/124; H01L 27/1255; H01L 27/12; G09G 3/3225; G02F 1/13454

USPC ............... 257/59, 40, 71, E21.412, E33.053; 438/158, 34, 149, 30

See application file for complete search history.

(56) References Cited

U.S. PATENT DOCUMENTS

2017/0162637 A1*   6/2017   Choi ..................... G09G 3/20
2017/0294497 A1*   10/2017   Lius ................... H01L 27/1255

FOREIGN PATENT DOCUMENTS

KR    10-0899052 B1    5/2009
KR    10-2016-0086503 A    7/2016

* cited by examiner

*Primary Examiner* — Mouloucoulaye Inoussa
(74) *Attorney, Agent, or Firm* — Lewis Roca Rothgerber Christie LLP

(57) ABSTRACT

An OLED device includes a substrate, a semiconductor element on the substrate and including an active layer, a first gate electrode on the active layer, a second gate electrode on the first gate electrode, and source and drain electrodes, a wiring connection structure electrically connected to the semiconductor element and including an active layer pattern spaced from the active layer and corresponding to a first region, a second region, a third region between the first region and the second region, and a fourth region, a first gate electrode pattern overlapping the active layer pattern and expose active pattern layer at the first region and the second region, and a second gate electrode pattern contacting a portion of the first gate electrode pattern in the third region, and contacting the active layer pattern in the first region, and a sub-pixel structure on the semiconductor element and the wiring connection structure.

20 Claims, 22 Drawing Sheets

FIG. 1
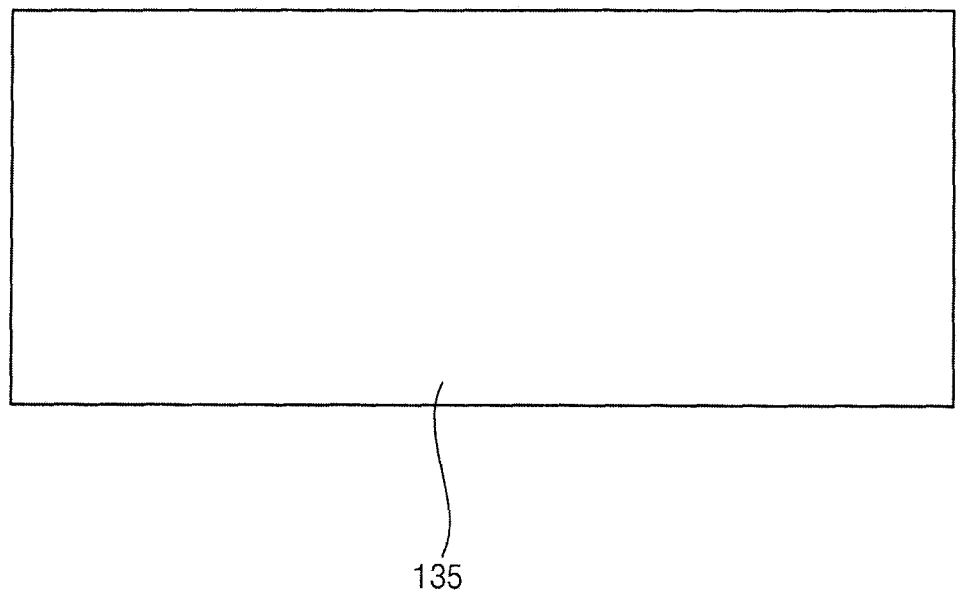
135

FIG. 3
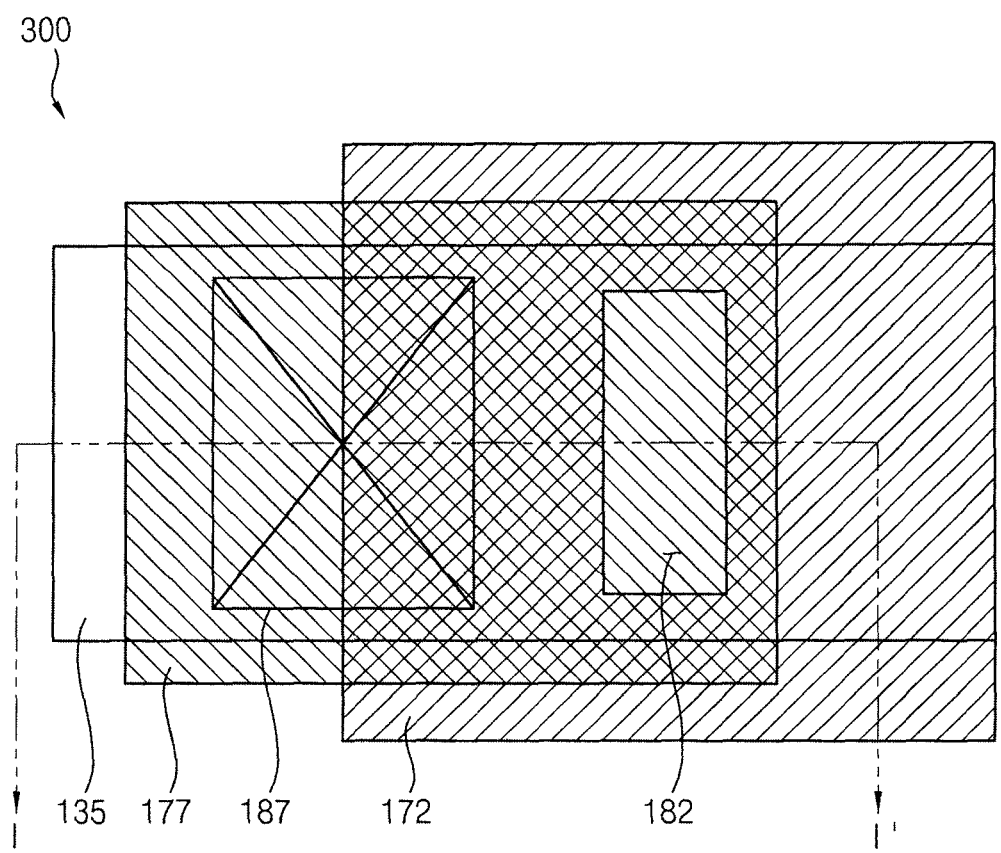
135 177 187  172      182
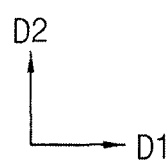

ORGANIC LIGHT EMITTING DISPLAY DEVICE

CROSS-REFERENCE TO RELATED APPLICATION

This application claims priority to, and the benefit of, Korean Patent Application No. 10-2016-0135727, filed on Oct. 19, 2016 in the Korean Intellectual Property Office (KIPO), the contents of which are incorporated herein in their entirety by reference.

BACKGROUND

1. Field

Some embodiments relate generally to organic light emitting display devices including a wiring connection structure.

2. Description of the Related Art

A flat panel display (FPD) device is widely used as a display device of an electronic device because the FPD device is lightweight and thin when compared to a cathode-ray tube (CRT) display device. Typical examples of FPD devices include a liquid crystal display (LCD) device and an organic light emitting display (OLED) device. Compared to the LCD device, the OLED device has many advantages, such as a higher luminance and a wider viewing angle. In addition, the OLED device can be made thinner because the OLED device does not require a backlight unit. In the OLED device, electrons and holes are respectively injected into an organic thin layer through a cathode and an anode, and are then recombined in the organic thin layer to generate excitons, thereby emitting light of a certain wavelength.

Recently, an ultra-high definition (UHD) OLED device has been developed. Here, the UHD OLED device may have a pixel area that is extremely small when compared to older OLED devices. In addition, as the size of the pixel area is reduced, the number of contact holes that are used to connect wirings located in different layers should also be decreased to reduce or minimize a coupling effect between wirings in a pixel circuit.

SUMMARY

Some embodiments provide an organic light emitting display device including a wiring structure.

According to some embodiments, an organic light emitting display (OLED) device includes a substrate, a semiconductor element on the substrate, the semiconductor element including an active layer, a first gate electrode on the active layer, a second gate electrode on the first gate electrode, and source and drain electrodes above the second gate electrode, a wiring connection structure electrically connected to the semiconductor element, the wiring connection structure including an active layer pattern spaced from the active layer on the substrate, the active layer pattern corresponding to a first region, a second region spaced from the first region, a third region between the first region and the second region, and a fourth region, a first gate electrode pattern overlapping the active layer pattern to expose the first region on the active layer pattern, and defining an opening that exposes the second region, and a second gate electrode pattern contacting a portion of the first gate electrode pattern in the third region, and contacting the active layer pattern in the first region, and a sub-pixel structure on the semiconductor element and the wiring connection structure.

The semiconductor element may further include a gate insulation layer on the substrate, the active layer, and the active layer pattern, and exposing the first region, and a first insulating interlayer on the gate insulation layer, the first gate electrode, and the first gate electrode pattern, and defining a contact hole overlapping the first region and the third region.

The first insulating interlayer may contact the gate insulation layer in the second region via the opening of the first gate electrode pattern.

The second gate electrode pattern may contact the first gate electrode pattern in the third region via the contact hole of the first insulating interlayer, and contacts the active layer pattern in the first region.

The first insulating interlayer may cover the first gate electrode pattern in the fourth region.

The second gate electrode pattern may extend in a direction from the first region into the fourth region, and fills the opening of the first gate electrode pattern, and the second gate electrode pattern may contact the first gate electrode pattern in the third region and in the fourth region, and may be connected to the active layer pattern in the second region.

The first region may include a first heavily doped region and a first lightly doped region that is adjacent the third region, and the second region may include a second lightly doped region that is adjacent the first lightly doped region, a third lightly doped region that is spaced from the second lightly doped region, and a second heavily doped region that is between the second lightly doped region and the third lightly doped region.

The semiconductor element may further include a gate insulation layer on the substrate, the active layer, and the active layer pattern, and exposing the active layer pattern at the first region and the second region, and a first insulating interlayer on the gate insulation layer, the first gate electrode, and the first gate electrode pattern, and defining a contact hole overlapping the first, second, third, and fourth regions.

The first insulating interlayer may expose a portion of the first gate electrode pattern at the fourth region.

The second gate electrode pattern may contact the first gate electrode pattern at the third region via the contact hole of the first insulating interlayer, and may be connected to the active layer pattern at the first region and the second region.

The second gate electrode pattern may be connected to the first heavily doped region, the first lightly doped region, the second lightly doped region, the second heavily doped region, and the third lightly doped region.

The semiconductor element may further include a gate insulation layer on the substrate, the active layer, and the active layer pattern, and exposing the first region and a portion of the second region, and a first insulating interlayer on the gate insulation layer, the first gate electrode, and the first gate electrode pattern, and defining a contact hole overlapping the first region, the third region, and a portion of the second region.

The gate insulation layer and the first insulating interlayer may be located above the third lightly doped region.

The second gate electrode pattern may contact the first gate electrode pattern at the third region via the contact hole of the first insulating interlayer, and may be connected to the first heavily doped region, the first lightly doped region, the second lightly doped region, and the second heavily doped region.

The first insulating interlayer may cover the first gate electrode pattern at the fourth region.

The semiconductor element may further include a second insulating interlayer on the second gate electrode and the second gate electrode pattern.

The active layer pattern may be configured to receive a gate signal, the first gate electrode pattern may be configured to receive the gate signal through the second gate electrode pattern, and the first gate electrode may be configured to receive the gate signal through the first gate electrode pattern.

The sub-pixel structure may include a lower electrode on the semiconductor element, a light emitting layer on the lower electrode, and an upper electrode on the light emitting layer.

An opening of the first gate electrode pattern may have a first width extending a first direction, and a second width extending a second direction that is perpendicular to the first direction, wherein the first width is greater than 0.2 micrometers, and wherein the second width is greater than 0.5 micrometers.

The active layer and the active layer pattern may include a same material, the first gate electrode and the first gate electrode pattern may include a same material, and the second gate electrode and the second gate electrode pattern may include a same material.

As the OLED device according to some embodiments includes the wiring connection structure, the second gate electrode pattern may be electrically connected to the active layer pattern and to the first gate electrode pattern, which are located in different layers, via one contact hole in a pixel area of reduced size of an ultra-high definition OLED device. Accordingly, the OLED device according to embodiments may reduce the number of the contact holes.

BRIEF DESCRIPTION OF THE DRAWINGS

Some embodiments can be understood in more detail from the following description taken in conjunction with the accompanying drawings, in which:

FIGS. 1, 2, and 3 are layout diagrams illustrating a wiring connection structure in accordance with some embodiments;

DETAILED DESCRIPTION

Figure 2:
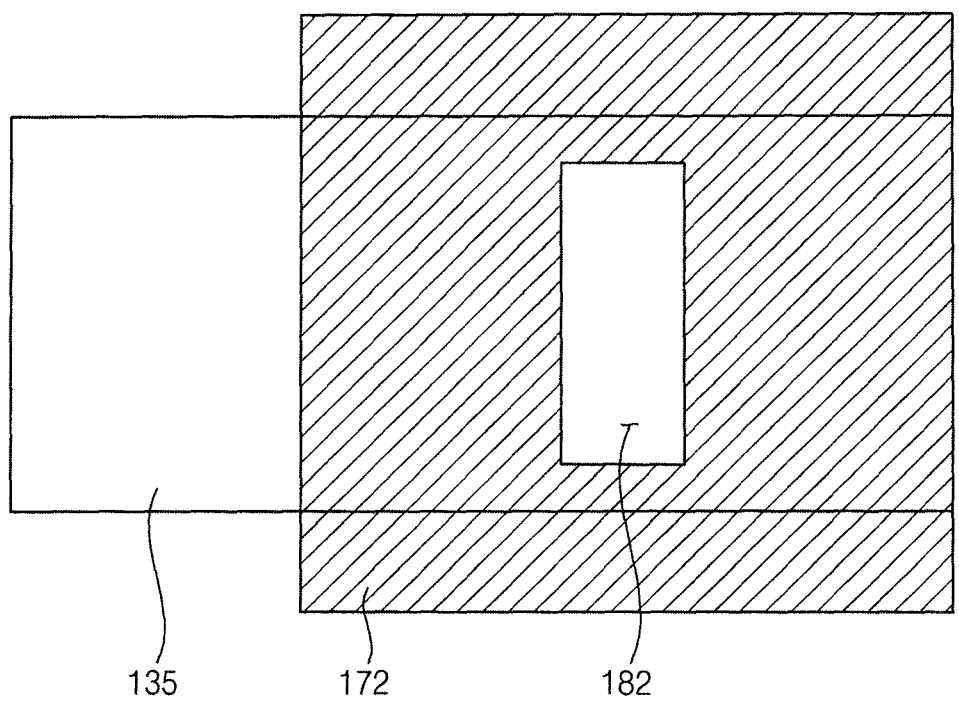

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 4:
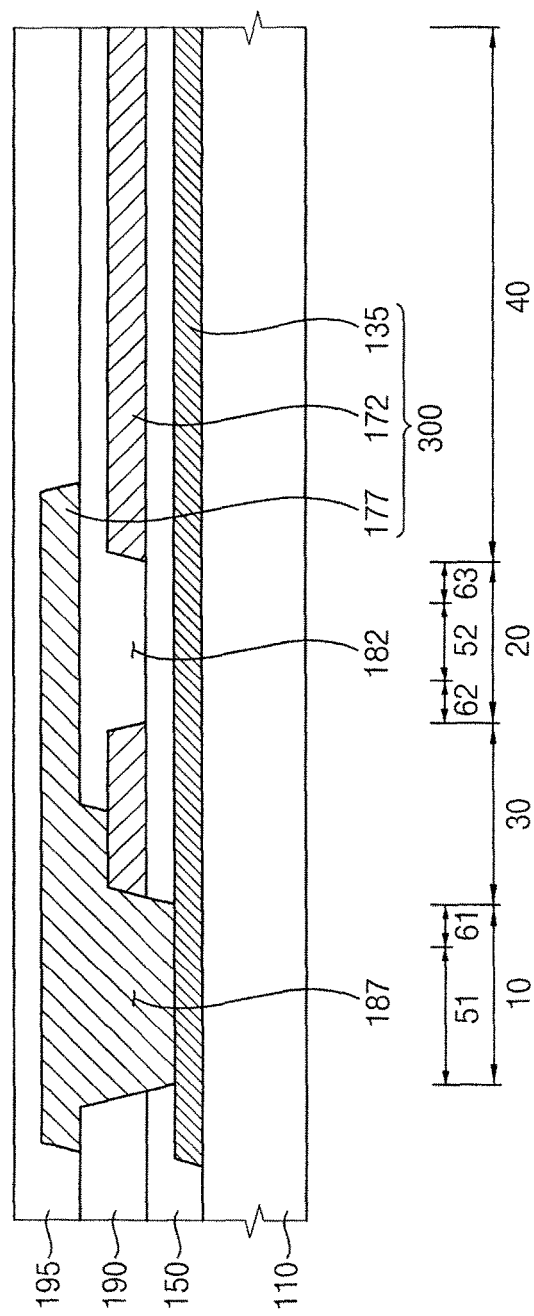
FIG. 4 is a cross-sectional view taken along the line I-I' of FIG. 3.
Figure 5:
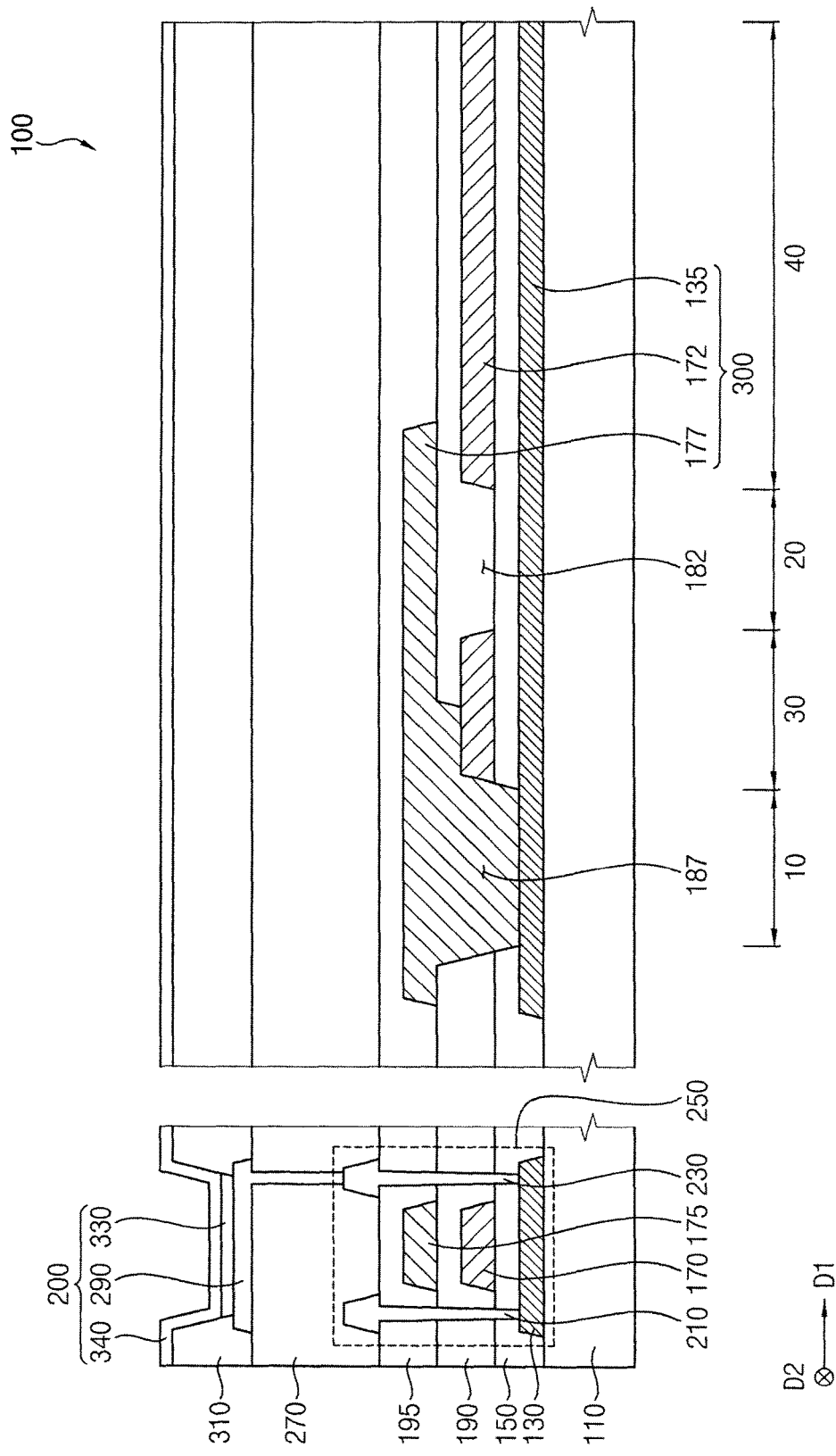
FIG. 5 is a cross-sectional view illustrating an organic light emitting display (OLED) device including a wiring connection structure in accordance with some embodiments.

FIGS. 1, 2, and 3 are layout diagrams illustrating a wiring connection structure in accordance with some embodiments. FIG. 4 is a cross-sectional view taken along the line I-I' of FIG. 3. FIG. 5 is a cross-sectional view illustrating an organic light emitting display (OLED) device including a wiring connection structure in accordance with some embodiments.

Referring to FIGS. 1, 2, 3, 4, and 5, an organic light emitting display (OLED) device 100 may include a substrate 110, a semiconductor element 250, a wiring connection structure 300, a planarization layer 270, a pixel defining layer 310, a sub-pixel structure 200, etc. Here, the semiconductor element 250 may include an active layer 130, a gate insulation layer 150, a first gate electrode 170, a first insulating interlayer 190, a second gate electrode 175, a second insulating interlayer 195, a source electrode 210, and a drain electrode 230. The wiring connection structure 300 may include an active layer pattern 135, a first gate electrode pattern 172, and a second gate electrode pattern 177. In addition, the sub-pixel structure 200 may include a lower electrode 290, a light emitting layer 330, and an upper electrode 340.

The substrate 110 may be provided. The substrate 110 may include transparent or opaque materials. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may include a flexible transparent material, such as a flexible transparent resin substrate (e.g., a polyimide substrate). For example, the polyimide substrate may include a first polyimide layer, a barrier film layer, a second polyimide layer, etc. Because the polyimide substrate is relatively thin and flexible, the polyimide substrate may be formed on a rigid glass substrate to help support the formation of an upper structure (e.g., the semiconductor element 250, the wiring connection structure 300, the sub-pixel structure 200, etc.). That is, the substrate 110 may have a structure in which the first polyimide layer, the barrier film layer, and the second polyimide layer are stacked on the rigid glass substrate. In manufacturing the OLED device 100, after an insulating layer (e.g., a buffer layer) is provided on the second polyimide layer of the polyimide substrate, the upper structure may be formed on the buffer layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 of the OLED device 100 after the removal of the rigid glass substrate.

A buffer layer may be located on the substrate 110. The buffer layer may be located on the entire substrate 110. The buffer layer may reduce or prevent the diffusion of metal atoms and/or impurities from the substrate 110 into the semiconductor element 250 and the sub-pixel structure 200. Additionally, the buffer layer may control a rate of heat transfer in a crystallization process for forming the active layer 130, thereby obtaining substantially uniformity of the active layer 130. Furthermore, the buffer layer may improve a surface flatness of the substrate 110 when a surface of the substrate 110 is otherwise relatively irregular. According to a type of the substrate 110, at least two buffer layers may be provided on the substrate 110, or the buffer layer may be omitted. For example, the buffer layer may include organic materials or inorganic materials.

The active layer 130 may be located on the substrate 110. For example, the active layer 130 may include an oxide semiconductor, an inorganic semiconductor (e.g., amorphous silicon, polysilicon, etc.), an organic semiconductor, etc. In some embodiments, the active layer 130 may be formed of polysilicon.

The active layer pattern 135 may be spaced apart from the active layer 130 on the substrate 110. The active layer pattern 135 may serve as a wiring. For example, the active layer pattern 135 may be a data signal wiring providing a data signal, a gate signal wiring providing a gate signal, an initialization signal wiring providing an initialization signal, an emission signal wiring providing an emission signal, a power supply voltage wiring providing a power supply voltage, etc. In some embodiments, the active layer pattern 135 may be the gate signal wiring. For example, the active layer pattern 135 may extend in a first direction D1, and may be electrically connected to a gate driving unit included in the OLED device 100. A gate signal provided from the gate driving unit may be applied to the active layer pattern 135, and the gate signal may be provided to the first gate electrode 170 of the semiconductor element 250 through the active layer pattern 135.

The active layer pattern 135 may have a first region 10, a second region 20, a third region 30, and a fourth region 40. Here, the third region 30 may be located between the first region 10 and the second region 20, and the fourth region 40 may be located adjacent to the second region 20. As illustrated in FIG. 4, the first region 10 may include a first heavily doped region 51 (or a first high concentration doping region 51) and a first lightly doped region 61 (or a first low concentration doping region 61), and the second region 20 may include a second lightly doped region 62 (or a second low concentration doping region 62), a second heavily doped region 52 (or a second high concentration doping region 52), and a third lightly doped region 63 (or a third low concentration doping region 63). In some embodiments, the active layer 130 of the semiconductor element 250 and the active layer pattern 135 of the wiring connection structure 300 may include a lightly doped drain (LDD) region. That is, by performing a LDD process, the active layer pattern 135 may have the first and second heavily doped regions 51 and 52 that are relatively heavily doped, and may have the first, second, and third lightly doped regions 61, 62, and 63 that are relatively lightly doped. Here, ions doped in the active layer pattern 135 may include boron B ions, phosphorus P ions, etc. The active layer pattern 135 may be simultaneously (or concurrently) formed using the same material.

The gate insulation layer 150 may be located on the substrate 110, the active layer 130, and the active layer pattern 135. In some embodiments, the gate insulation layer 150 may cover the active layer 130 on the substrate 110, and may extend in the first direction D1. In addition, the gate insulation layer 150 may define a hole to expose the first region 10 of the active layer pattern 135. For example, the gate insulation layer 150 may sufficiently cover the active layer 130 and the active layer pattern 135 on the substrate 110, and may have a substantially level surface without a step around the active layer 130 and the active layer pattern 135. Alternatively, the gate insulation layer 150 may cover the active layer 130 and the active layer pattern 135 on the substrate 110, and may have a substantially uniform thickness along a profile of the active layer 130 and the active layer pattern 135. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The first gate electrode 170 may be located on the gate insulation layer 150. The first gate electrode 170 may be located on a portion of the gate insulation layer 150, and may be above the active layer 130. The first gate electrode 170 may include a metal, an alloy of a metal, metal nitride, conductive metal oxide, transparent conductive materials, etc. These may be used alone or in a suitable combination thereof. In some embodiments, the first gate electrode 170 may have a multi-layered structure.

The first gate electrode pattern 172 may be located on the active layer pattern 135 and the gate insulation layer 150. In some embodiments, as illustrated in FIG. 2, the first gate electrode pattern 172 may overlap the active layer pattern 135, and may define a hole such that the first gate electrode pattern 172 exposes the first region 10 of the active layer pattern 135. In addition, the first gate electrode pattern 172 may also have an opening 182 that exposes the second region 20, and the opening 182 may have a first width extending in the first direction D1 and a second width extending in a second direction D2 that is perpendicular to the first direction D1. The first width may be greater than about 0.2 micrometers, and the second width may be greater than about 0.5 micrometers. For example, the opening 182 may be formed to additionally secure (e.g., obtain) the second heavily doped region 52. When the second gate electrode pattern 177 is connected to the active layer pattern 135 at the first region 10, a contact area of the second gate electrode pattern 177 and the active layer pattern 135 may not be sufficiently secured. In this case, by extending a contact hole 187 of the first insulating interlayer 190 in the first direction D1, the second gate electrode pattern 177 may be further connected to the second heavily doped region 52 of the active layer pattern 135. Accordingly, the contact area of the second gate electrode pattern 177 and the active layer pattern 135 may be increased. That is, to secure the second heavily doped region 52 in the second region 20, the first width and the second width may be determined. The first gate electrode pattern 172 may be electrically connected to the first gate electrode 170, and the gate signal provided from the active layer pattern 135 may be applied to the first gate electrode pattern 172 through the second gate electrode pattern 177. Thus, the first gate electrode pattern 172 may provide the gate signal to the first gate electrode 170. The first gate electrode pattern 172 and the first gate electrode 170 may be simultaneously formed using the same material. For example, the first gate electrode pattern 172 may include gold (Au), silver (Ag), aluminum (Al), platinum (Pt), nickel (Ni), titanium (Ti), palladium (Pd), magnesium (Mg), calcium (Ca), lithium (Li), chrome (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the first gate electrode pattern 172 may have a multi-layered structure.

The first insulating interlayer 190 may be located on the gate insulation layer 150, the first gate electrode 170, and the first gate electrode pattern 172. In some embodiments, the first insulating interlayer 190 may cover the first gate electrode 170, and may extend in the first direction D1. In addition, the first insulating interlayer 190 may have/define the contact hole 187 that overlaps the first region 10 and at least a portion of the third region 30. In other words, the first insulating interlayer 190 may expose an upper surface of the active layer pattern 135 in the first region 10, and may expose at least a portion of the second gate electrode pattern 177 in the third region 30. Further, the first insulating interlayer 190 may be in contact with the gate insulation layer 150 located in the second region 20 of the active layer pattern 135 via the opening 182 of the first gate electrode pattern 172. Also, the first insulating interlayer 190 may cover the first gate electrode pattern 172 in the fourth region 40. For example, the first insulating interlayer 190 may sufficiently cover the first gate electrode 170 and the first gate electrode pattern 172, and may have a substantially level surface without a step around the first gate electrode 170 and the first gate electrode pattern 172. Alternatively, the first insulating interlayer 190 may cover the first gate electrode 170 and the first gate electrode pattern 172, and may have a substantially uniform thickness along a profile of the first gate electrode 170 and the first gate electrode pattern 172. The first insulating interlayer 190 may include silicon compound, metal oxide, etc.

The second gate electrode 175 may be located on the first insulating interlayer 190, and may be located above the first gate electrode 170. The second gate electrode 175 may include a metal, an alloy of a metal, metal nitride, conductive metal oxide, transparent conductive materials, etc. These may be used alone or in a suitable combination thereof. Alternatively, the second gate electrode 175 may have a multi-layered structure.

The second gate electrode pattern 177 may be located on the first gate electrode pattern 172 and the first insulating interlayer 190. The second gate electrode pattern 177 may contact at least a portion of the first gate electrode pattern 172 located in the third region 30 of the active layer pattern 135. The second gate electrode patter 177 may be connected to the first region 10 of the active layer pattern 135. In other words, the second gate electrode pattern 177 may be in contact with at least a portion of the first gate electrode pattern 172 located in the third region 30 via the contact hole 187 of the first insulating interlayer 190, and may also be connected to the first region 10 of the active layer pattern 135. As the second gate electrode pattern 177 is in direct contact with at least a portion of the first gate electrode pattern 172 and with the first region 10 through the contact hole 187, the gate signal applied to the active layer pattern 135 may be provided to the first gate electrode pattern 172, and the gate signal may be applied to the first gate electrode 170 through the first gate electrode pattern 172 that is electrically connected to the first gate electrode 170.

For example, to electrically connect two wirings located in different layers in a conventional OLED device, a connection wiring may electrically connect the two wirings located in different layers via two contact holes. In this case, a contact area may be relatively greatly increased. However, the OLED device 100 according to some embodiments corresponds to ultra-high definition (UHD) OLED devices, and may have a pixel area that is relatively greatly reduced. Thus, the second gate electrode pattern 177 may be electrically connected to the active layer pattern 135 and the first gate electrode pattern 172 that are located in different layers via a single contact hole 187. Accordingly, the OLED device 100 may reduce the number of contact holes 187. In addition, when a contact area of the second gate electrode pattern 177 and the active layer pattern 135 is sufficiently secured in the first region 10, the second gate electrode pattern 177 may be connected to the second heavily doped region 52 of the active layer pattern 135 without formation of an additional contact hole by extending the contact hole 187 of the first insulating interlayer 190 in the first direction D1. Accordingly, the contact area of the second gate electrode pattern 177 and the active layer pattern 135 may be relatively increased without a formation of an additional contact hole, and a contact resistance of the second gate electrode pattern 177 and the active layer pattern 135 may be relatively reduced. The second gate electrode pattern 177 and the second gate electrode 175 may be formed during a same process and using the same material. For example, the second gate electrode pattern 177 may include a metal, an alloy of a metal, metal nitride, conductive metal oxide, transparent conductive materials, etc. These may be used alone or in a suitable combination thereof. Alternatively, the second gate electrode pattern 177 may have a multi-layered structure. Accordingly, the wiring connection structure 300 including the active layer pattern 135, the first gate electrode pattern 172, and the second gate electrode pattern 177 may be formed as described.

In some embodiments, the wiring connection structure 300 of the OLED device 100 constitutes the active layer pattern 135, the first gate electrode pattern 172, and the second gate electrode pattern 177, but not being limited thereto. For example, in some embodiments, the wiring connection structure 300 has a configuration of source and drain electrode patterns, the active layer pattern 135, and the first gate electrode pattern 172, or has a configuration of source and drain electrode patterns, the active layer pattern 135, and the second gate electrode pattern 177.

The second insulating interlayer 195 may be located on the first insulating interlayer 190, the second gate electrode 175, and the second gate electrode pattern 177. The second insulating interlayer 195 may cover the second gate electrode 175, and may extend in the first direction D1. In addition, the second insulating interlayer 195 may cover an entirety of the first insulating interlayer 190. For example, the second insulating interlayer 195 may sufficiently cover the second gate electrode 175 and the second gate electrode pattern 177, and may have a substantially level surface without a step around of the second gate electrode 175 and the second gate electrode pattern 177. Alternatively, the second insulating interlayer 195 may cover the second gate electrode 175 and the second gate electrode pattern 177, and may have a substantially uniform thickness along a profile of the second gate electrode 175 and the second gate electrode pattern 177. The second insulating interlayer 195 may include silicon compound, metal oxide, etc.

The source electrode 210 and the drain electrode 230 may be located on the second insulating interlayer 195. The source electrode 210 may be in direct contact with a first side (e.g., a source region) of the active layer 130 via a contact hole formed by removing a portion of the gate insulation layer 150, a portion of the first insulating interlayer 190, and a portion of the second insulating interlayer 195. The drain electrode 230 may be in direct contact with a second side (e.g., a drain region) of the active layer 130 via a contact hole formed by removing another portion of the gate insulation layer 150, another portion of the first insulating interlayer 190, and another portion the second insulating interlayer 195. Each of the source electrode 210 and the drain electrode 230 may include a metal, an alloy of a metal, metal nitride, conductive metal oxide, transparent conductive materials, etc. These may be used alone or in a suitable combination thereof. Alternatively, each of the source and drain electrodes 210 and 230 may have a multi-layered structure. Accordingly, the semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be formed as described.

In some embodiments, the semiconductor element 250 of the OLED device 100 has a top gate structure, but not being limited thereto. For example, in some embodiments, the semiconductor element 250 may have a bottom gate structure.

The planarization layer 270 may be located on the second insulating interlayer 195, the source electrode 210, and the drain electrode 230. The planarization layer 270 may cover the source electrode 210 and the drain electrode 230, and may extend in the first direction D1. In addition, the planarization layer 270 may be located on the entire second insulating interlayer 195. For example, the planarization layer 270 may be sufficiently thick to cover the second insulating interlayer 195 and the source and drain electrodes 210 and 230. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In some embodiments, the planarization layer 270 may include organic materials. For example, the planarization layer 270 may include a polyimide-based resin, a photoresist, an acryl-based resin, a polyamide-based resin, a siloxane-based resin, etc.

The lower electrode 290 may be located on the planarization layer 270. The lower electrode 290 may be located on a portion of the planarization layer 270, and may be above the semiconductor element 250. The lower electrode 290 may be in contact with the drain electrode 230 via a contact hole formed by removing a portion of the planarization layer 270. In addition, the lower electrode 290 may be electrically connected to the semiconductor element 250. For example, the lower electrode 290 may include a metal, an alloy of a metal, metal nitride, conductive metal oxide, transparent conductive materials, etc. These may be used alone or in a suitable combination thereof. Alternatively, the lower electrode 290 may have a multi-layered structure.

The pixel defining layer 310 may be located on a portion of the lower electrode 290 and the planarization layer 270. The pixel defining layer 310 may cover both lateral portions of the lower electrode 290, and may extend in the first direction D1. The pixel defining layer 310 may include organic materials or inorganic materials. In some embodiments, the pixel defining layer 310 may include organic materials.

The light emitting layer 330 may be located in a portion where an upper surface of the lower electrode 290 is exposed by the pixel defining layer 310. The light emitting layer 330 may be formed using at least one of light emitting materials capable of generating different colors of light (e.g., a red color of light, a blue color of light, and/or a green color of light) according to sub-pixels. Alternatively, the light emitting layer 330 may generally generate a white color of light by stacking a plurality of light emitting materials capable of generating different colors of light, such as a red color of light, a green color of light, and/or a blue color of light. In this case, a color filter may be located on the light emitting layer 330 (e.g., to overlap the light emitting layer 330 on a lower surface of an encapsulation substrate). The color filter may include at least one selected from a red color filter, a green color filter, and/or a blue color filter. Alternatively, the color filter may include a yellow color filter, a cyan color filter, and/or a magenta color filter. The color filter may include a photosensitive resin or a color photoresist.

The upper electrode 340 may be located on the pixel defining layer 310 and the light emitting layer 330. The upper electrode 340 may cover the light emitting layer 330 and the pixel defining layer 310, and may extend in the first direction D1. In addition, the upper electrode 340 may be located on an entirety of the pixel defining layer 310. The upper electrode 340 may include a metal, an alloy of a metal, metal nitride, conductive metal oxide, transparent conductive materials, etc. These may be used alone or in a suitable combination thereof. Alternatively, the upper electrode 340 may have a multi-layered structure. Accordingly, the sub-pixel structure 200 including the lower electrode 290, the light emitting layer 330, and the upper electrode 340 may be formed as described.

An encapsulation substrate may be located on the upper electrode 340. The encapsulation substrate and the substrate 110 may include substantially the same material. For example, the encapsulation substrate may include a quartz substrate, a synthetic quartz substrate, a calcium fluoride substrate, a fluoride-doped quartz substrate, a sodalime glass substrate, a non-alkali glass substrate, etc. In some embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may include a stacked structure where at least one inorganic layer and at least one organic layer are alternately stacked.

As the OLED device 100 according to some embodiments includes the wiring connection structure 300, the second gate electrode pattern 177 may be electrically connected to the active layer pattern 135 and the first gate electrode pattern 172, which are located in different layers, via a single contact hole 187 in a pixel area having a size that is relatively greatly reduced of the UHD OLED device 100. Accordingly, the OLED device 100 may reduce the number of the contact holes.

FIGS. 6, 7, 8, 9, 10, 11, 12, 13, 14, 15, 16, 17 and 18 are cross-sectional views illustrating a method of manufacturing an OLED device including a wiring connection structure in accordance with some embodiments.

Figure 6:
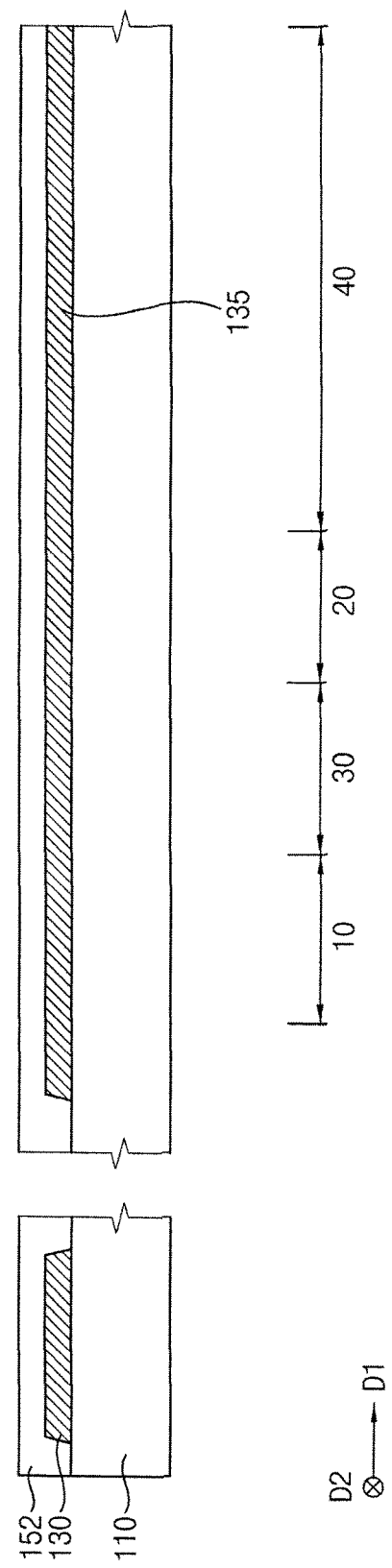
FIGS. 6, 7, 8, 9, 10, 11, 12, 13, 14, 15, 16, 17, and 18 are cross-sectional views illustrating a method of manufacturing an OLED device including a wiring connection structure in accordance with some embodiments.

Referring to FIG. 6, a substrate 110 may be provided. The substrate 110 may include transparent or opaque materials. For example, the substrate 110 may be formed using a quartz substrate, a synthetic quartz substrate, a calcium fluoride substrate, a fluoride-doped quartz substrate, a sodalime glass substrate, a non-alkali glass substrate etc.

A buffer layer may be formed on the substrate 110. The buffer layer may be formed on the entire substrate 110. The buffer layer may reduce or prevent the diffusion of metal atoms and/or impurities from the substrate 110 into a semiconductor element and a sub-pixel structure. Additionally, the buffer layer may control a rate of heat transfer in a crystallization process for forming an active layer, thereby obtaining a substantially uniform the active layer. Furthermore, the buffer layer may improve a surface flatness of the substrate 110 when a surface of the substrate 110 is relatively irregular. According to a type of the substrate 110, at least two buffer layers may be provided on the substrate 110, or the buffer layer may be omitted. For example, the buffer layer may be formed using organic materials or inorganic materials.

An active layer 130 and an active layer pattern 135 may be formed on the substrate 110. For example, after a preliminary active layer is formed on the entire substrate 110, the active layer 130 and the active layer pattern 135 may be formed by partially removing the preliminary active layer. That is, the active layer pattern 135 and the active layer 130 may be formed during a same process (e.g., simultaneously formed) using the same material. The active layer pattern 135 may be spaced apart from the active layer 130 on the substrate 110. The active layer pattern 135 may serve as a wiring. For example, the active layer pattern 135 may be a data signal wiring providing a data signal, a gate signal wiring providing a gate signal, an initialization signal wiring providing an initialization signal, an emission signal wiring providing an emission signal, a power supply voltage wiring providing a power supply voltage, etc. In some embodiments, the active layer pattern 135 may be the gate signal wiring. For example, the active layer pattern 135 may extend in a first direction D1, and may be electrically connected to a gate driving unit included in an OLED device. A gate signal provided from the gate driving unit may be applied to the active layer pattern 135, and the gate signal may be provided to the first gate electrode of the semiconductor element, which will be described below, through the active layer pattern 135. The active layer pattern 135 may have a first region 10, a second region 20, a third region 30, and a fourth region 40. Here, the third region 30 may be located between the first region 10 and the second region 20, and the fourth region 40 may be located adjacent to the second region 20. The active layer 130 and the active layer pattern 135 may include an oxide semiconductor, an inorganic semiconductor, an organic semiconductor, etc. In some embodiments, each of the active layer 130 and the active layer pattern 135 may be formed using polysilicon.

A preliminary gate insulation layer 152 may be formed on the substrate 110, the active layer 130, and the active layer pattern 135. In some embodiments, the preliminary gate insulation layer 152 may cover the active layer 130 on the substrate 110, and may extend in a first direction D1. In addition, the preliminary gate insulation layer 152 may be formed on the entire substrate 110. For example, the preliminary gate insulation layer 152 may sufficiently cover the active layer 130 and the active layer pattern 135, and may have a substantially level surface without a step around the active layer 130 and the active layer pattern 135. Alternatively, the preliminary gate insulation layer 152 may cover the active layer 130 and the active layer pattern 135 on the substrate 110, and may be formed to have substantially uniform thickness along a profile of the active layer 130 and the active layer pattern 135. The preliminary gate insulation layer 152 may include silicon compound, metal oxide, etc. For example, the preliminary gate insulation layer 152 may be formed using SiOx, SiNx, SiOxNy, SiOxCy, SiCxNy, AlOx, AlNx, TaOx, HfOx, ZrOx, TiOx, etc.

Figure 7:
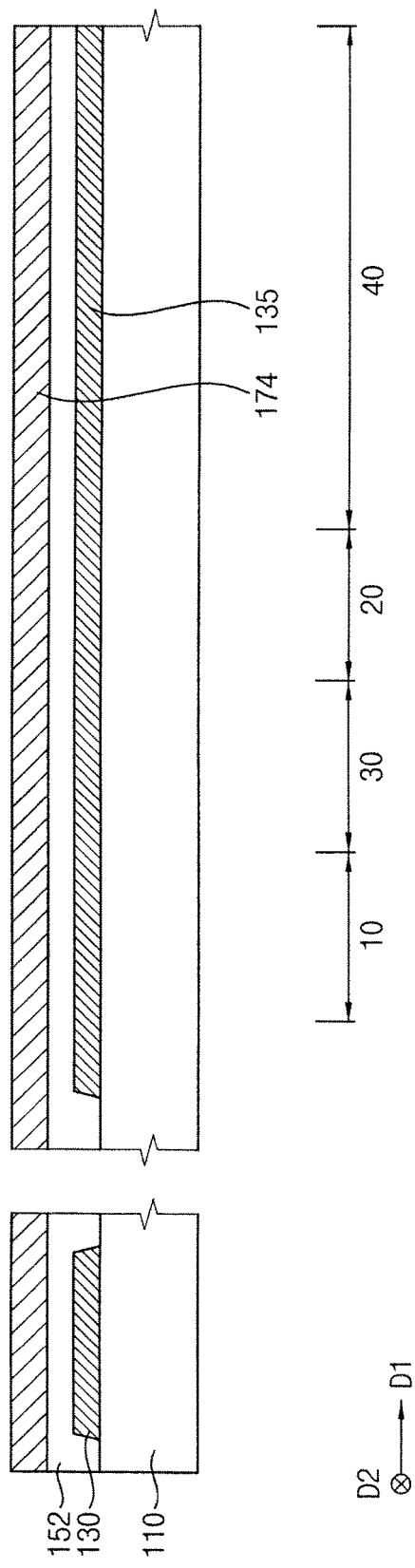

Referring to FIG. 7, a preliminary gate electrode layer 174 may be formed on the preliminary gate insulation layer 152. The preliminary gate electrode layer 174 may extend in the first direction D1 on the preliminary gate insulation layer 152, and may be formed on the entire preliminary gate insulation layer 152. The preliminary gate electrode layer 174 may be formed using Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, the preliminary gate electrode layer 174 may have a multi-layered structure.

Figure 8:
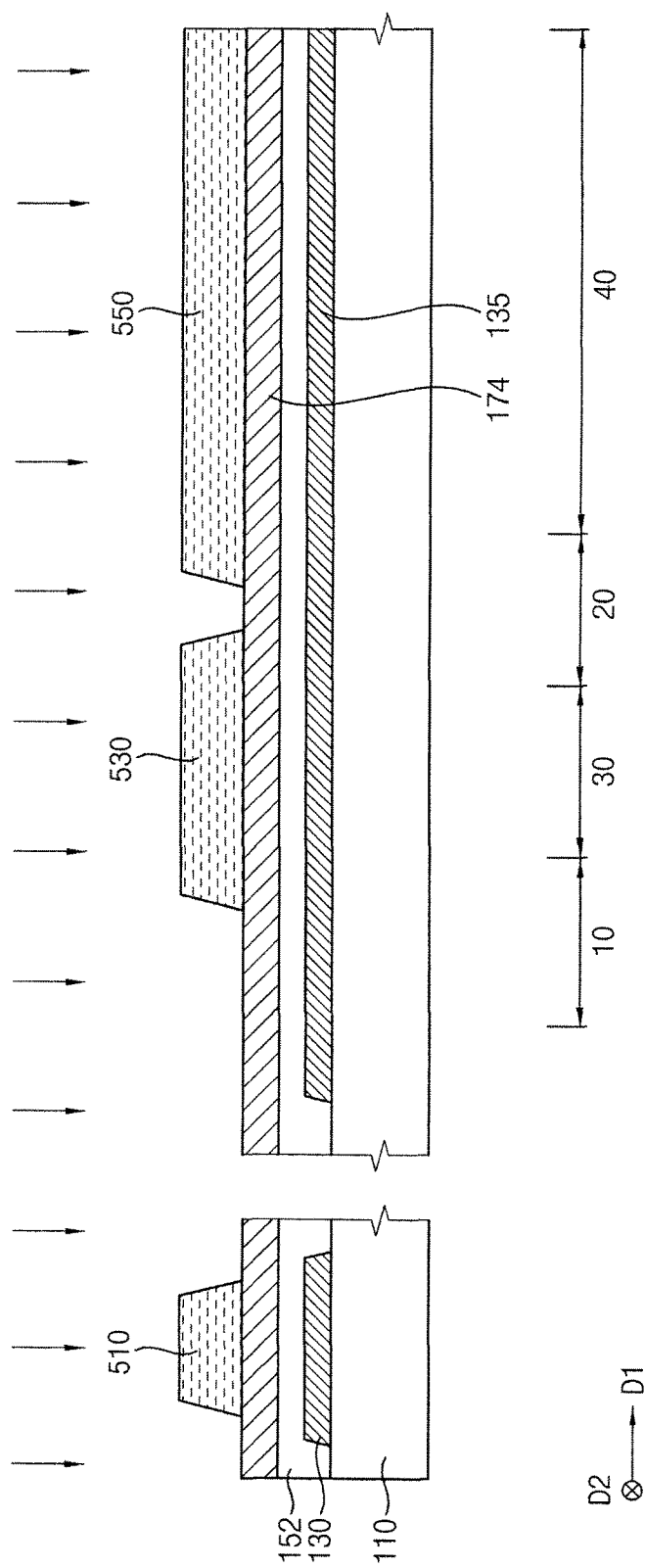

Referring to FIG. 8, first, second, and third photoresists 510, 530, and 550 may be formed on the preliminary gate electrode layer 174. For example, the first photoresist 510 may be formed on the active layer 130, and the second photoresist 530 may be formed on the third region 30, on a portion of the first region 10, and on a portion of the second region 20. In addition, the third photoresist 550 may be formed on the fourth region 40 and on a portion of the second region 20. After the first, second, and third photoresists 510, 530, and 550 are formed, the preliminary gate electrode layer 174 may be partially removed using the first, second, and third photoresists 510, 530, and 550 as a mask (e.g., a first dry etching process). For example, a selective etching process may be performed in the preliminary gate electrode layer 174.

Figure 9:
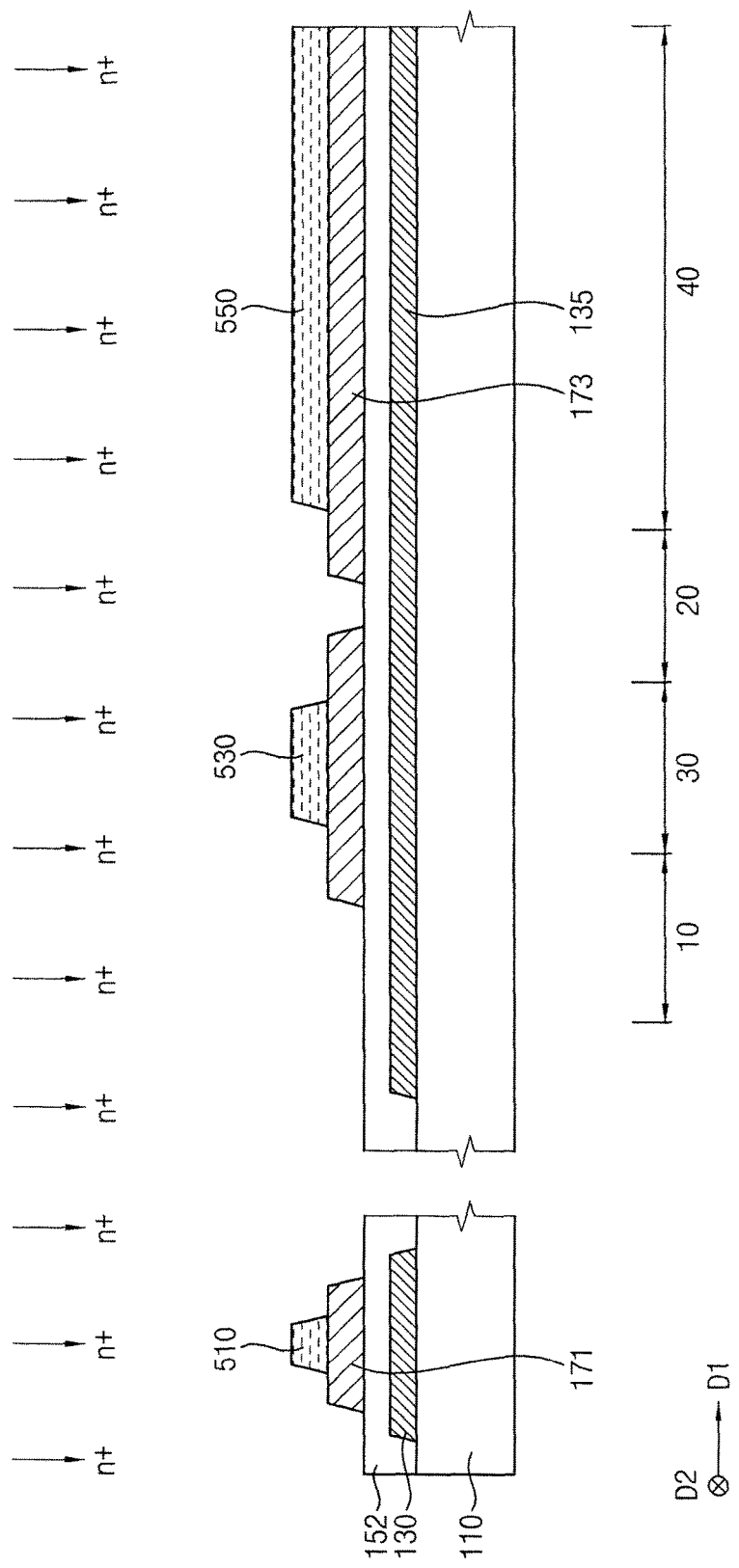

Referring to FIG. 9, after the selective etching process is performed in the preliminary first gate electrode layer 174, a preliminary first gate electrode 171 may be formed on the active layer 130, and a preliminary first gate electrode pattern 173 may be formed on the active layer pattern 135. After the preliminary first gate electrode 171 and the preliminary first gate electrode pattern 173 are formed, a high concentration ion doping n+ may be performed on/over the entire substrate 110. As illustrated in FIG. 4, after the high concentration ion doping n+ is performed, a first heavily doped region 51 may be formed in the first region 10 of the active layer pattern 135, and a second heavily doped region 52 may be formed in the second region 20 of the active layer pattern 135. In other words, because a first lightly doped region 61, a second lightly doped region 62, and a third lightly doped region 63 overlap the preliminary first gate electrode pattern 173, the high concentration ion may not be doped in those regions. Here, the ions may be formed using boron B ions, phosphorus P ions, etc. Meanwhile, while the first dry etching process is performed, a size of the first, second, and third photoresists 510, 530, and 550 each may be relatively reduced (as compared to a size of the first, second, and third photoresists 510, 530, and 550 before the first dry etching process). Here, the first, second, and third photoresists 510, 530, and 550 that have a reduced size may be defined as first, second, and third photoresists 511, 531, and 551, respectively (see FIG. 10).

Figure 10:
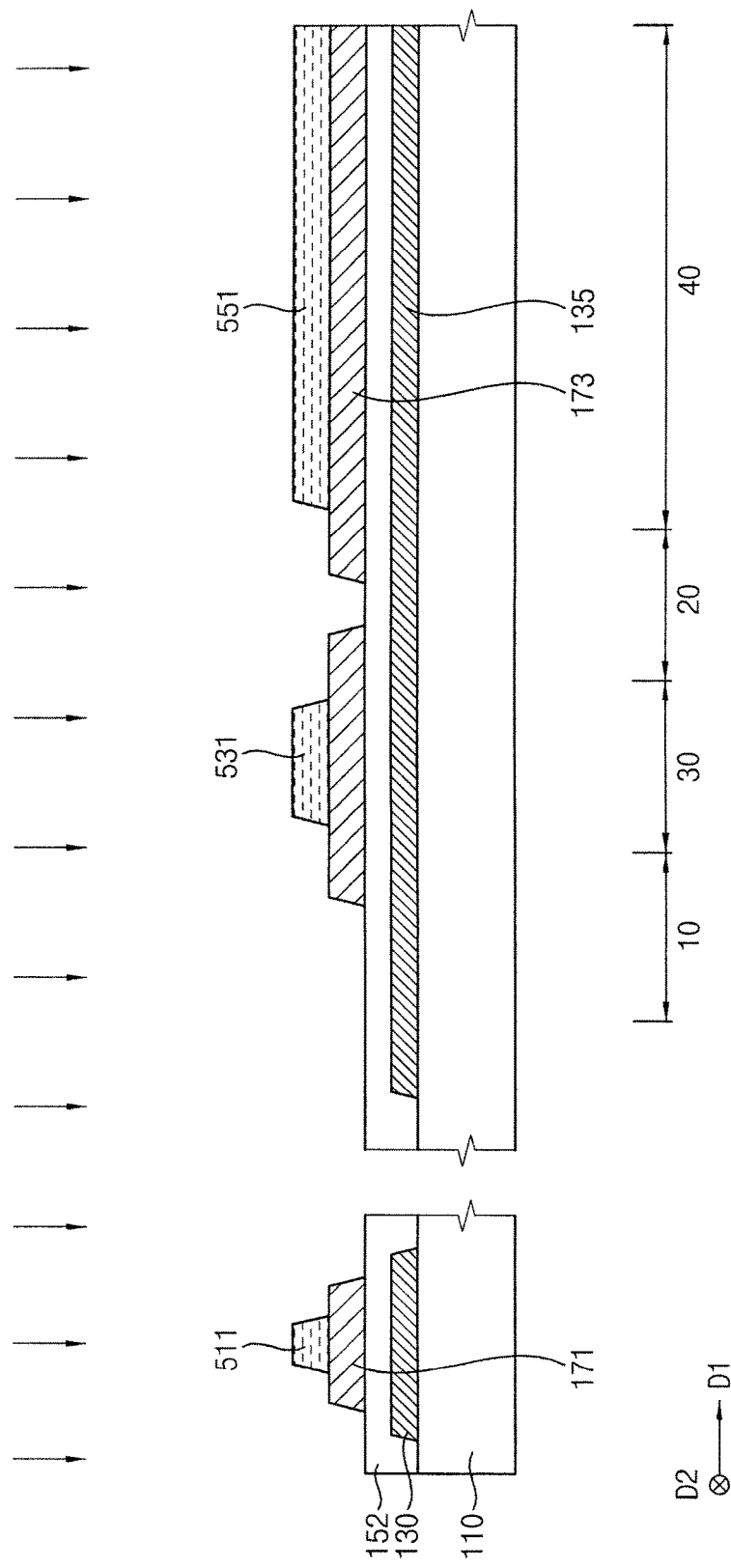

Referring to FIG. 10, the preliminary first gate electrode 171 and the preliminary gate electrode layer 174 may be partially removed using the first, second, and third photoresists 511, 531, and 551 as a mask (e.g., a second dry etching process).

Figure 11:
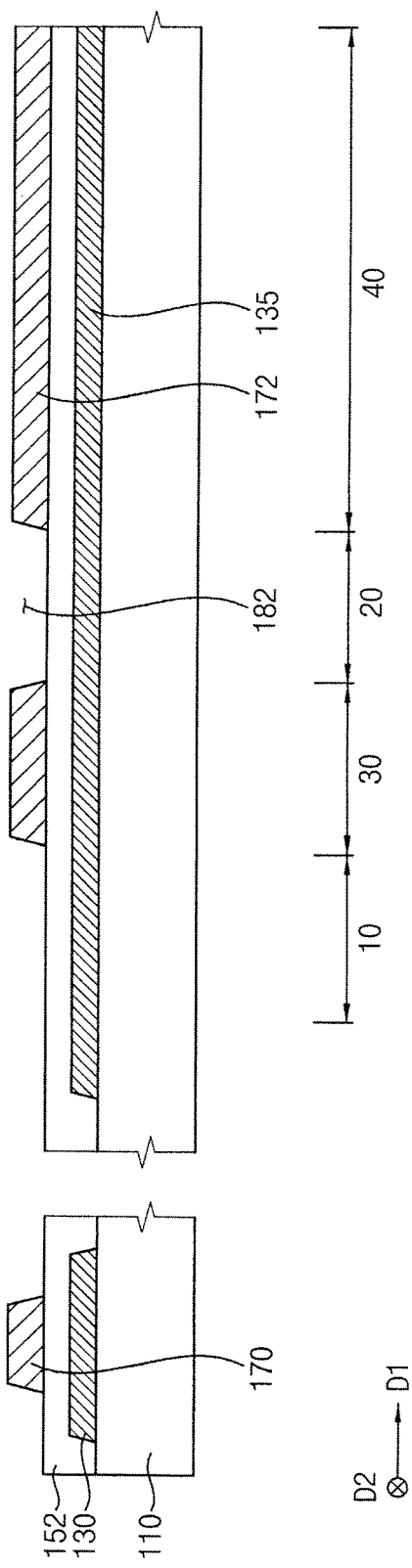

Referring to FIG. 11, a first gate electrode 170 on the active layer 130 and a first gate electrode pattern 172 on the active layer pattern 135 may be formed after a selective etching process is performed on the preliminary first gate electrode 171 and the preliminary gate electrode layer 174. In addition, an opening 182 that exposes the second region 20 may be formed in the first gate electrode pattern 172.

The first gate electrode pattern 172 may be formed to overlap the active layer pattern 135 such that the first gate electrode pattern 172 exposes the first region 10 of the active layer pattern 135. In addition, the first gate electrode pattern 172 may have an opening 182 that exposes the second region 20. The opening 182 may be formed to additionally secure the second heavily doped region 52. When a second gate electrode pattern, which will be described below, is connected to the first region 10 of the active layer pattern 135, a contact area of the second gate electrode pattern and the active layer pattern 135 may not be sufficiently secured. In this case, by extending a contact hole of the first insulating interlayer, which will be described below, in the first direction D1, the second gate electrode pattern may be additionally connected to the second heavily doped region 52 of the active layer pattern 135 without a formation of an additional contact hole (e.g., see FIG. 20). Accordingly, the contact area of the second gate electrode pattern and the active layer pattern 135 may be increased without a formation of an additional contact hole.

As described above, the first gate electrode pattern 172 and the first gate electrode 170 may be simultaneously formed using the same material.

Figure 12:
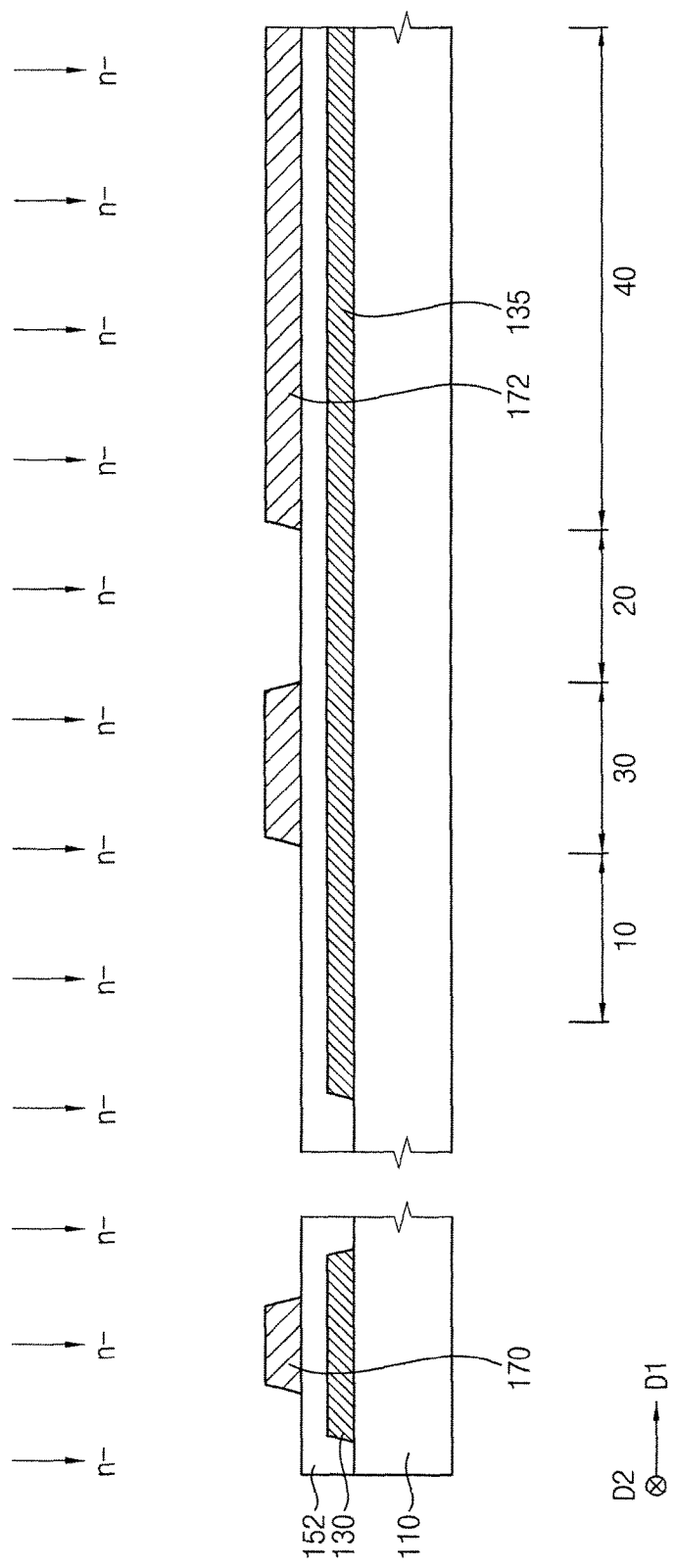
Figure 13:
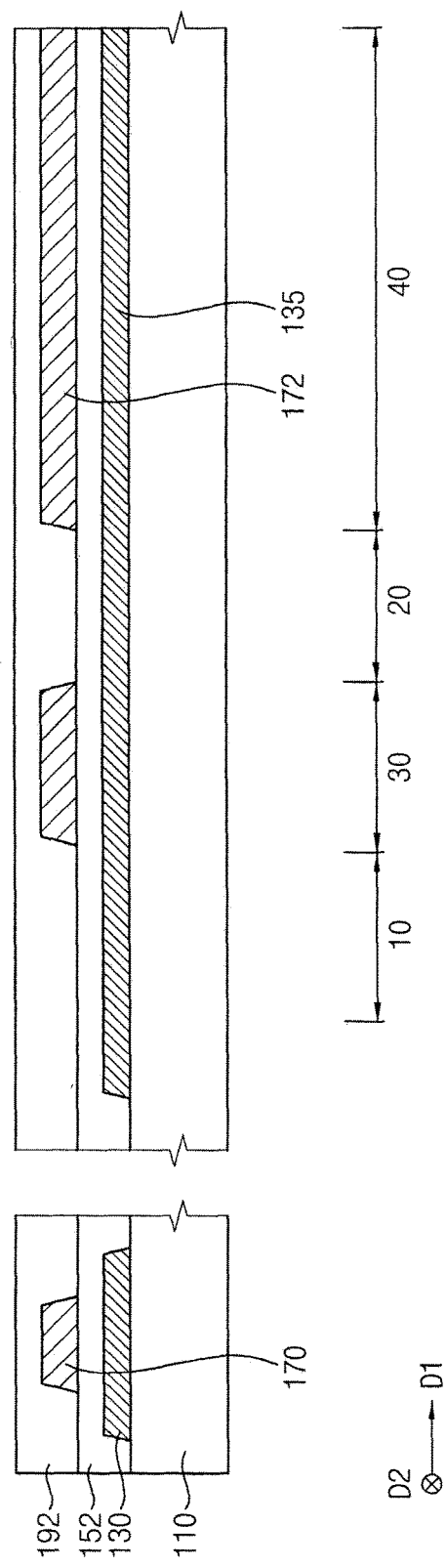

Referring to FIG. 12, after the first gate electrode 170 and the first gate electrode pattern 172 are formed, a low concentration ion doping n– may be performed on/over the entire substrate 110. As illustrated in FIG. 4, after the low concentration ion doping n– is performed, the first lightly doped region 61 may be formed in the first region 10 of the active layer pattern 135, and the second lightly doped region 62 and the third lightly doped region 63 may be formed in the second region 20 of the active layer pattern 135. In addition, a heavily doped region and a lightly doped region may be formed in the active layer 130. In other words, the active layer 130 and the active layer pattern 135 may have a LDD region.

A preliminary first insulating interlayer 192 may be formed on the preliminary gate insulation layer 152, the first gate electrode 170, and the first gate electrode pattern 172. In some embodiments, the preliminary first insulating interlayer 192 may cover the first gate electrode 170 and the first gate electrode pattern 172 on the preliminary gate insulation layer 152, and may be formed on the entire preliminary gate insulation layer 152. For example, the preliminary first insulating interlayer 192 may sufficiently cover the first gate electrode 170 and the first gate electrode pattern 172, and may have a substantially level surface without a step around the first gate electrode 170 and the first gate electrode pattern 172. Alternatively, the preliminary first insulating interlayer 192 may cover the first gate electrode 170 and the first gate electrode pattern 172, and may have a substantially uniform thickness along a profile of the first gate electrode 170 and the first gate electrode pattern 172. The first insulating interlayer 190 may include silicon compound, metal oxide, etc. The preliminary first insulating interlayer 192 may be formed using silicon compound, metal oxide, etc.

Figure 14:
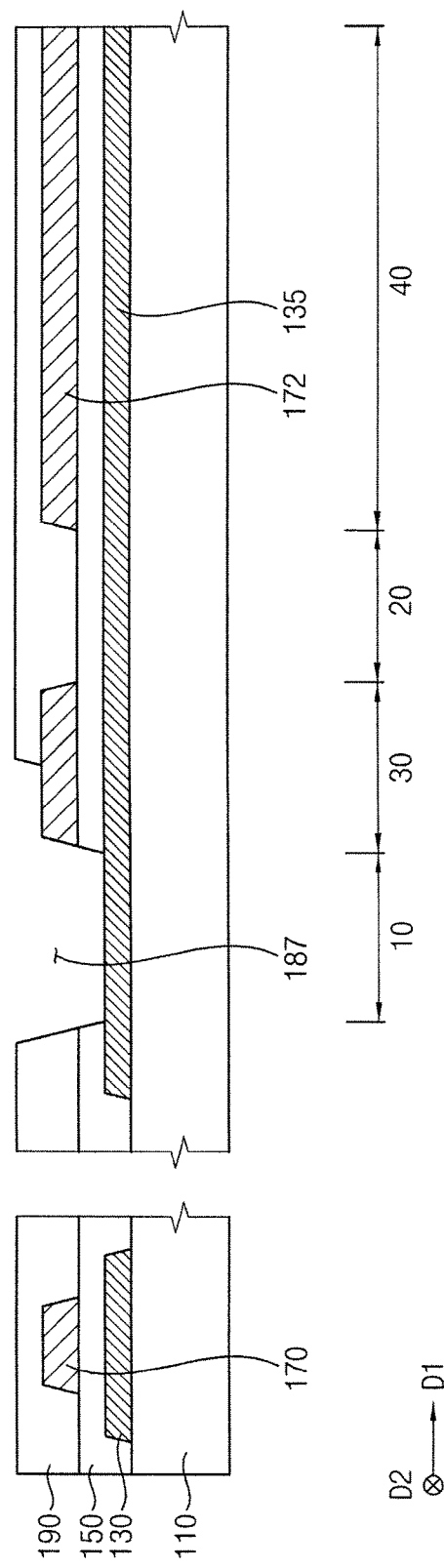

Referring to FIG. 14, a contact hole 187 that overlaps the first region 10 and at least a portion of the third region 30 may be formed. As the contact hole 187 is formed, a gate insulation layer 150 and a first insulating interlayer 190 may be formed. In other words, the first insulating interlayer 190 and the gate insulation layer 150 may expose an upper surface of the active layer pattern 135 in the first region 10, and the first insulating interlayer 190 may expose at least a portion of the second gate electrode pattern 177 in the third region 30. In addition, the first insulating interlayer 190 may be in contact with the gate insulation layer 150 in the second region 20 via the opening 182 of the first gate electrode pattern 172, and the first insulating interlayer 190 may cover the first gate electrode pattern 172 in the fourth region 40.

Figure 15:
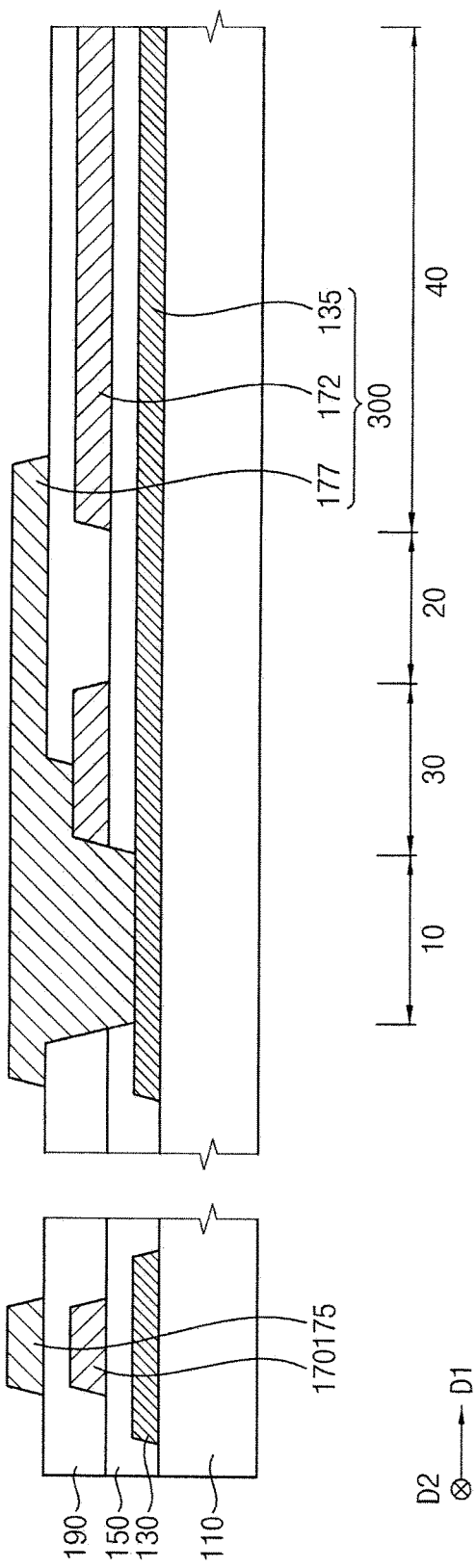

Referring to FIG. 15, a second gate electrode 175 may be formed on the first insulating interlayer 190, and may be located on a portion of the first insulating interlayer 190 under which the first gate electrode 170 is formed. In addition, a second gate electrode pattern 177 may be formed on the first gate electrode pattern 172 and the first insulating interlayer 190. For example, a preliminary second gate electrode layer may be formed on the entire substrate 110, and the second gate electrode 175 and the second gate electrode pattern 177 may be formed by partially removing the preliminary second gate electrode layer after the preliminary second gate electrode layer is formed. That is, the second gate electrode 175 and the second gate electrode pattern 177 may be formed during a same process (e.g., simultaneously formed) using the same material.

The second gate electrode pattern 177 may be in contact with at least a portion of the first gate electrode pattern 172 in the third region 30 of the active layer pattern 135, and may be connected to the first region 10 of the active layer pattern 135. In other words, the second gate electrode pattern 177 may be in contact with at least a portion of the first gate electrode pattern 172 formed in the third region 30 via the contact hole 187 of the first insulating interlayer 190, and may be connected to the first region 10 of the active layer pattern 135. As the second gate electrode pattern 177 is in direct contact with at least a portion of the first gate electrode pattern 172 and the first region 10 through the contact hole 187, a gate signal applied to the active layer pattern 135 may be provided to the first gate electrode pattern 172, and the gate signal may be applied to the first gate electrode 170 through the first gate electrode pattern 172 that is electrically connected to the first gate electrode 170. Each of the second gate electrode 175 and the second gate electrode pattern 177 may include a metal, an alloy of a metal, metal nitride, conductive metal oxide, transparent conductive materials, etc. These may be used alone or in a suitable combination thereof. Alternatively, each of the second gate electrode 175 and the second gate electrode pattern 177 may have a multi-layered structure. Accordingly, a wiring connection structure 300 including the active layer pattern 135, the first gate electrode pattern 172, and the second gate electrode pattern 177 may be formed.

Figure 16:
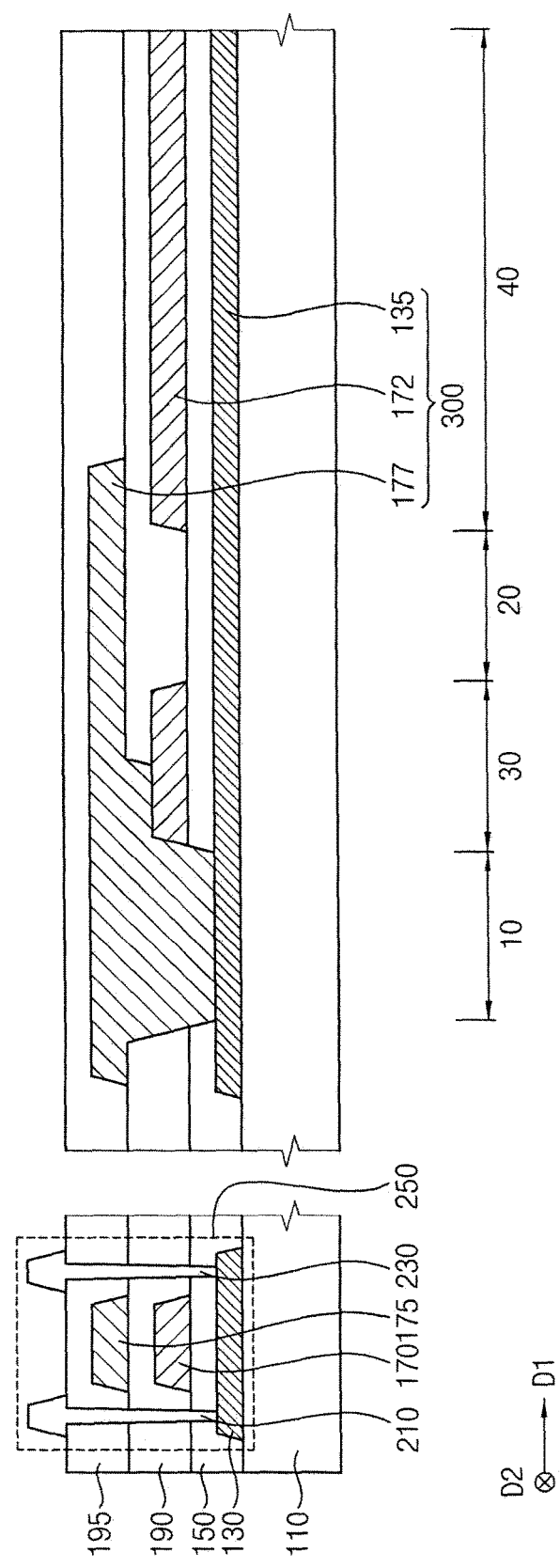

Referring to FIG. 16, a second insulating interlayer 195 may be formed on the first insulating interlayer 190, the second gate electrode 175, and the second gate electrode pattern 177. The second insulating interlayer 195 may cover the second gate electrode 175, and may extend in the first direction D1. In addition, the second insulating interlayer 195 may be formed on the entire first insulating interlayer 190. For example, the second insulating interlayer 195 may sufficiently cover the second gate electrode 175 and the second gate electrode pattern 177, and may have a substantially level surface without a step around of the second gate electrode 175 and the second gate electrode pattern 177. Alternatively, the second insulating interlayer 195 may cover the second gate electrode 175 and the second gate electrode pattern 177, and may have a substantially uniform thickness along a profile of the second gate electrode 175 and the second gate electrode pattern 177. The second insulating interlayer 195 may be formed using silicon compound, metal oxide, etc.

Source electrode 210 and the drain electrode 230 may be formed on the second insulating interlayer 195. The source electrode 210 may be in direct contact with a first side of the active layer 130 via a contact hole formed by removing respective portions of the gate insulation layer 150, the first insulating interlayer 190, and the second insulating interlayer 195 each. The drain electrode 230 may be in direct contact with a second side of the active layer 130 via a contact hole formed by removing other respective portions of the gate insulation layer 150, the first insulating interlayer 190, and the second insulating interlayer 195. Each of the source electrode 210 and the drain electrode 230 may be formed using a metal, an alloy of a metal, metal nitride, conductive metal oxide, transparent conductive materials, etc. These may be used alone or in a suitable combination thereof. Alternatively, each of the source and drain electrodes 210 and 230 may have a multi-layered structure. Accordingly, a semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be formed.

Figure 17:
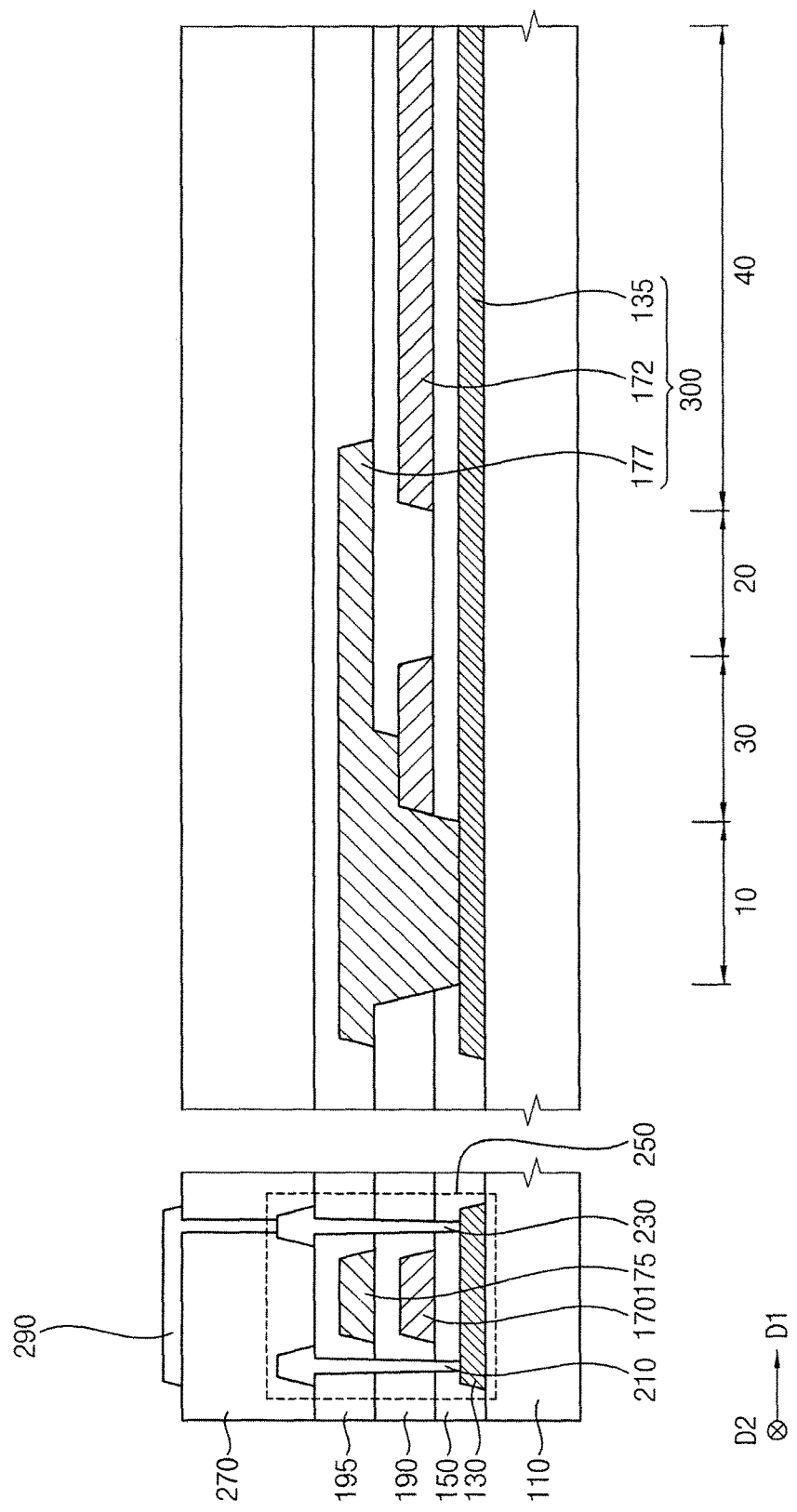

Referring to FIG. 17, a planarization layer 270 may be formed on the second insulating interlayer 195, the source electrode 210, and the drain electrode 230. The planarization layer 270 may cover the source electrode 210 and the drain electrode 230, and may extend in the first direction D1. In addition, the planarization layer 270 may be located on the entire second insulating interlayer 195. For example, the planarization layer 270 may be formed to have sufficient thickness to cover the second insulating interlayer 195 and the source and drain electrodes 210 and 230. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In some embodiments, the planarization layer 270 may include organic materials. For example, the planarization layer 270 may be formed using a polyimide-based resin, a photoresist, an acryl-based resin, a polyamide-based resin, a siloxane-based resin, etc.

A lower electrode 290 may be formed on the planarization layer 270. For example, the lower electrode 290 may be formed on a portion of the planarization layer 270 under which the semiconductor element 250 is located. The lower electrode 290 may be in contact with the drain electrode 230 via a contact hole formed by removing a portion of the planarization layer 270. In addition, the lower electrode 290 may be electrically connected to the semiconductor element 250. For example, the lower electrode 290 may be formed using a metal, an alloy of a metal, metal nitride, conductive metal oxide, transparent conductive materials, etc. These may be used alone or in a suitable combination thereof. Alternatively, the lower electrode 290 may have a multi-layered structure.

Figure 18:
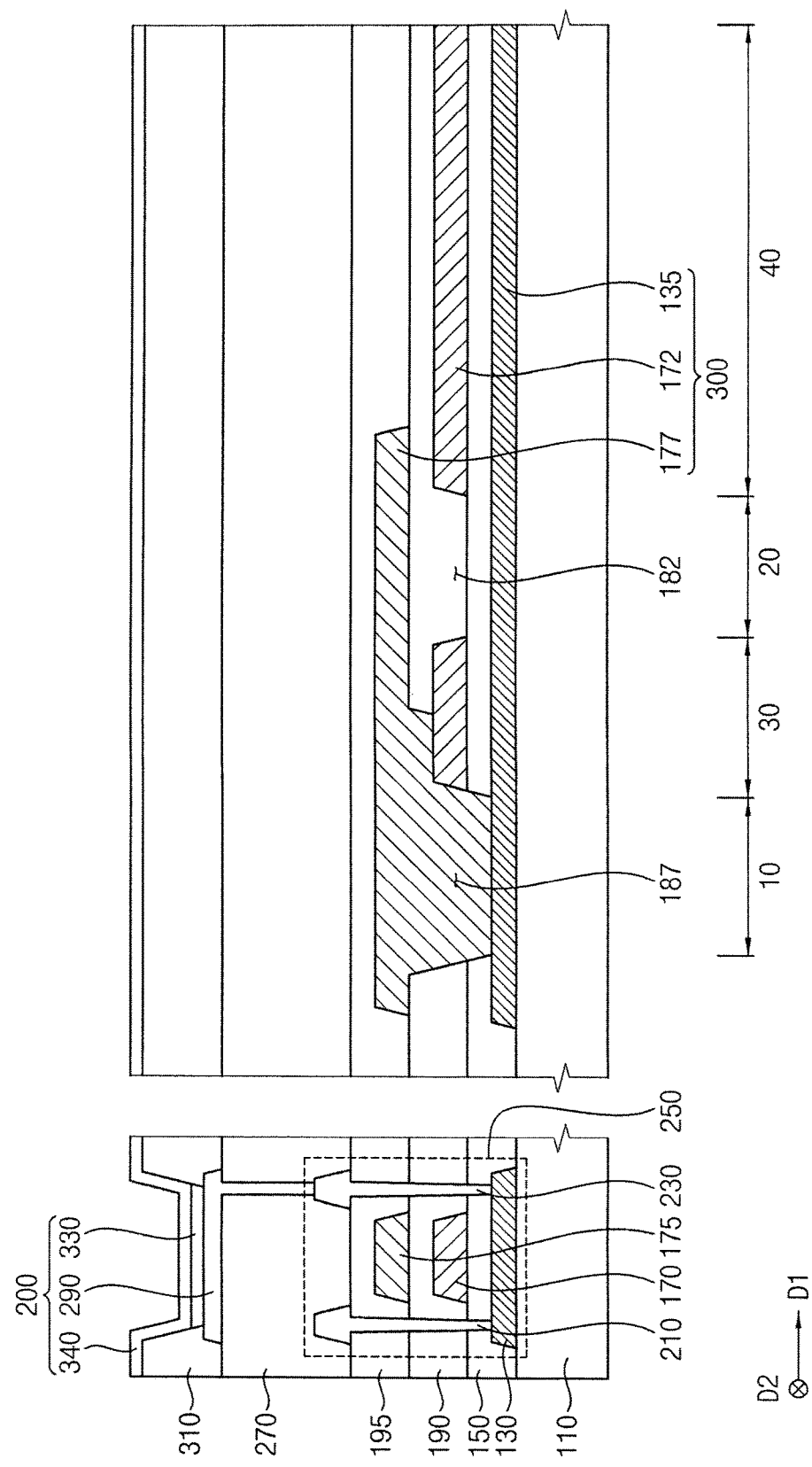

Referring to FIG. 18, a pixel defining layer 310 may be formed on a portion of the lower electrode 290 and the planarization layer 270. The pixel defining layer 310 may cover both lateral portions of the lower electrode 290, and extend in the first direction D1. The pixel defining layer 310 may include organic materials or inorganic materials. In some embodiments, the pixel defining layer 310 may be formed using organic materials.

A light emitting layer 330 may be formed in a portion where an upper surface of the lower electrode 290 is exposed by the pixel defining layer 310. The light emitting layer 330 may be formed using at least one of light emitting materials capable of generating different colors of light (e.g., a red color of light, a blue color of light, and a green color of light) according to sub-pixels. Alternatively, the light emitting layer 330 may generally generate a white color of light by stacking a plurality of light emitting materials capable of generating different colors of light such as a red color of light, a green color of light, and a blue color of light. In this case, a color filter may be located on the light emitting layer 330 (e.g., to overlap the light emitting layer 330 on a lower surface of an encapsulation substrate). The color filter may include at least one selected from a red color filter, a green color filter, and a blue color filter. Alternatively, the color filter may include a yellow color filter, a cyan color filter, and a magenta color filter. The color filter may be formed using a photosensitive resin or a color photoresist.

An upper electrode 340 may be formed on the pixel defining layer 310 and the light emitting layer 330. The upper electrode 340 may cover the light emitting layer 330 and the pixel defining layer 310, and may extend in the first direction D1. In addition, the upper electrode 340 may be formed on the entire pixel defining layer 310. The upper electrode 340 may be formed using a metal, an alloy of a metal, metal nitride, conductive metal oxide, transparent conductive materials, etc. These may be used alone or in a suitable combination thereof. Alternatively, the upper electrode 340 may have a multi-layered structure. Accordingly, the sub-pixel structure 200 including the lower electrode 290, the light emitting layer 330, and the upper electrode 340 may be formed.

An encapsulation substrate may be formed on the upper electrode 340. The encapsulation substrate and the substrate 110 may include substantially the same material. For example, the encapsulation substrate may be formed using a quartz substrate, a synthetic quartz substrate, a calcium fluoride substrate, a fluoride-doped quartz substrate, a sodalime glass substrate, a non-alkali glass substrate, etc. In some embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may include a stacked structure where at least one inorganic layer and at least one organic layer are alternately stacked. Accordingly, an OLED device 100 illustrated in FIG. 5 may be manufactured.

Figure 19:
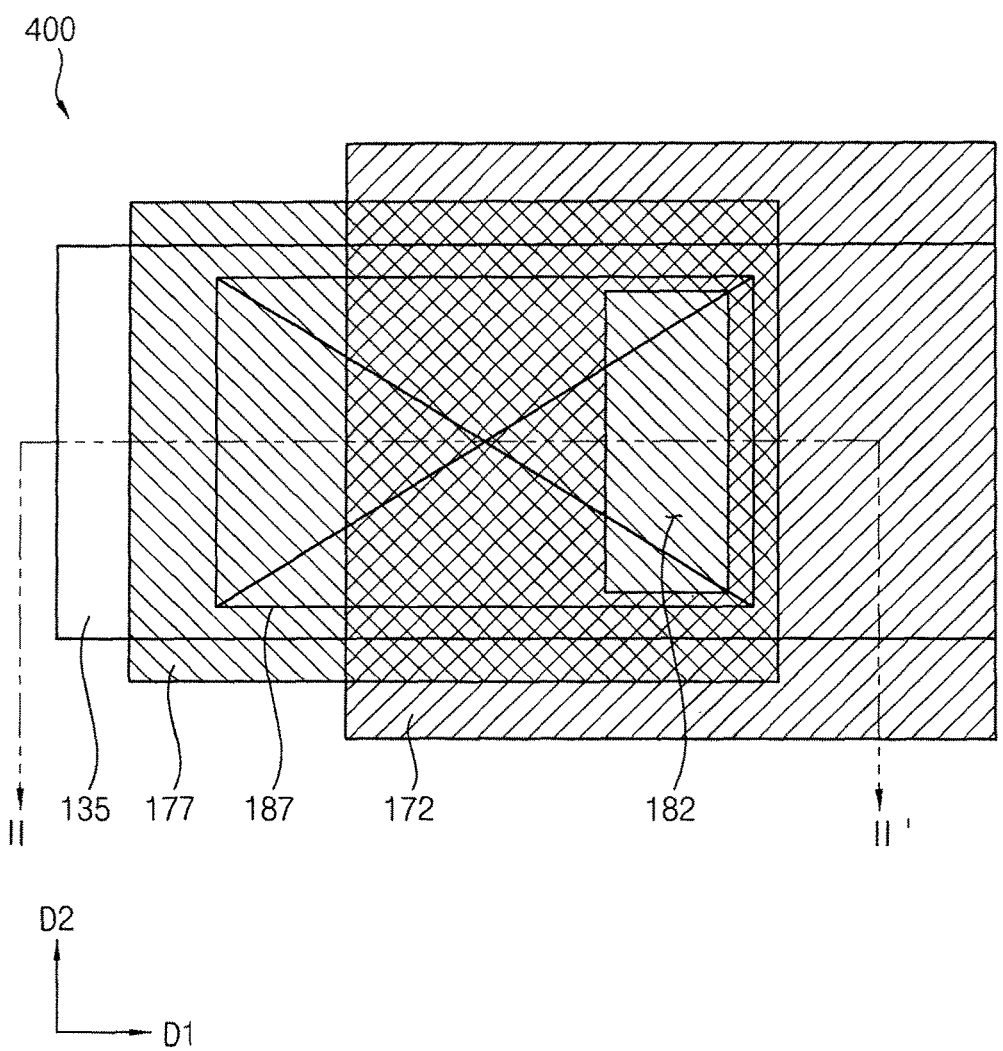
FIG. 19 is a layout diagram illustrating a wiring connection structure in accordance with some embodiments.
Figure 20:
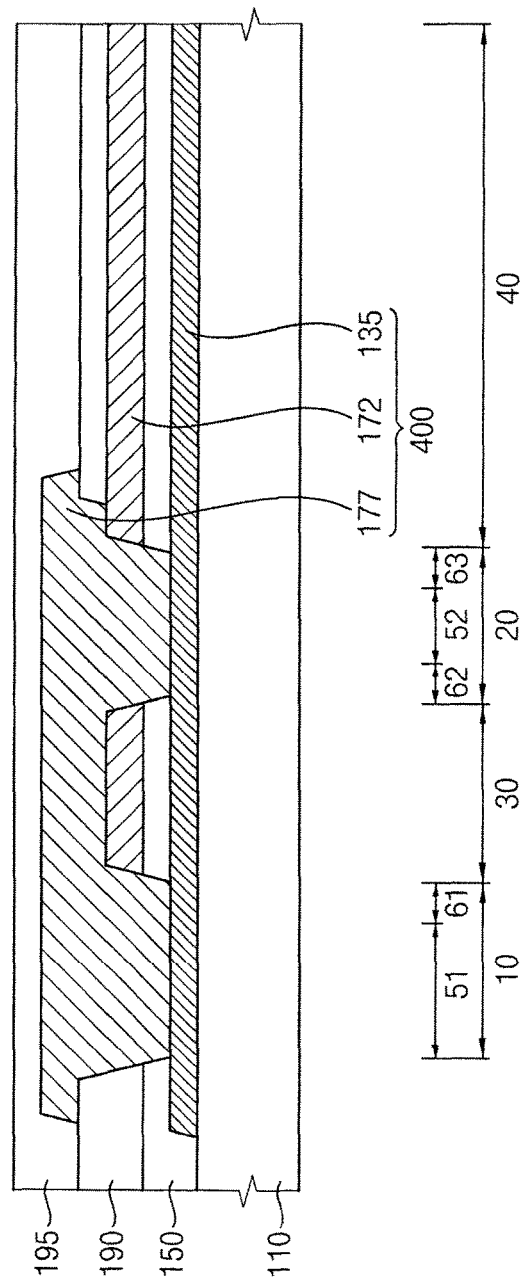
FIG. 20 is a cross-sectional view taken along the line II-II' of FIG. 19.

FIG. 19 is a layout diagram illustrating a wiring connection structure in accordance with some embodiments, and FIG. 20 is a cross-sectional view taken along the line II-II' of FIG. 19. A wiring connection structure 400 illustrated in FIGS. 19 and 20 may have a configuration that is substantially the same as, or similar to, that of the wiring connection structure 300 included in the OLED device 100 described with reference to FIGS. 1, 2, 3, 4 and 5 with the exception of a shape of a gate insulation layer 150, a shape of a first insulating interlayer 190, and a shape of a second gate electrode pattern 177. In FIGS. 19 and 20, detailed descriptions for elements that are substantially the same as or similar to elements described with reference to FIGS. 1, 2, 3, 4 and 5 may not be repeated.

Referring to FIGS. 19 and 20, a wiring connection structure 400 may include an active layer pattern 135, a first gate electrode pattern 172, and a second gate electrode pattern 177.

The gate insulation layer 150 may be located on the substrate 110, the active layer 130, and the active layer pattern 135. In some embodiments, the gate insulation layer 150 may cover the active layer 130 on the substrate 110, and may extend in the first direction D1. In addition, the gate insulation layer 150 may expose the first region 10 and the second region 20 that are included in the active layer pattern 135.

The first gate electrode pattern 172 may be located on the active layer pattern 135 and the gate insulation layer 150. In some embodiments, the first gate electrode pattern 172 may be located to overlap the active layer pattern 135 such that the first gate electrode pattern 172 exposes the first region 10 of the active layer pattern 135. In addition, the first gate electrode pattern 172 may have an opening that exposes the second region 20. In other words, the first gate electrode pattern 172 may expose an upper surface of the active layer pattern 135 located in the second region 20 via the opening.

The first insulating interlayer 190 may be located on the gate insulation layer 150, the first gate electrode 170, and the first gate electrode pattern 172. In some embodiments, the first insulating interlayer 190 may cover the first gate electrode 170, and may extend in the first direction D1. In addition, the first insulating interlayer 190 may have a contact hole that overlaps the first region 10, the second region 20, the third region 30, and a portion of the fourth region 40. In other words, the first insulating interlayer 190 may expose an upper surface of the active layer pattern 135 in the first region 10, and may expose an upper surface of the first gate electrode pattern 172 in the third region 30. In addition, the first insulating interlayer 190 may expose an upper surface of the active layer pattern 135 in the second region 20, and may expose a portion of the first gate electrode pattern 172 in the fourth region 40.

The second gate electrode pattern 177 may be located on the first gate electrode pattern 172 and the first insulating interlayer 190. The second gate electrode pattern 177 may be in contact with the first gate electrode pattern 172 located in the third region 30 of the active layer pattern 135 and a portion of the first gate electrode pattern 172 located in the fourth region 40, and may be connected to the active layer pattern 135 in the first region 10 and the second region 20. In other words, the second gate electrode pattern 177 may be in contact with the first gate electrode pattern 172 located in the third region 30 and the at least a portion of the first gate electrode pattern 172 located in the fourth region 40 via the contact hole of the first insulating interlayer 190, and may be connected to the first region 10 and the second region 20. Thus, the second gate electrode pattern 177 may be connected to the first heavily doped region 51 and the first lightly doped region 61 that are included in the first region 10, and may be connected to the second lightly doped region 62, the second heavily doped region 52, and the third lightly doped region 63 that are included in the second region 20. As the second gate electrode pattern 177 is in direct contact with the first gate electrode pattern 172, and with the active layer pattern 135 in the first region 10 and in the second region 20, through the contact hole of the first insulating interlayer 190, a gate signal applied to the active layer pattern 135 may be provided to the first gate electrode pattern 172, and the gate signal may be applied to the first gate electrode 170 through the first gate electrode pattern 172 that is electrically connected to the first gate electrode 170.

Accordingly, as compared to FIGS. 1, 2, 3, 4, and 5, by extending the contact hole of the first insulating interlayer 190 in the first direction D1, the second gate electrode pattern 177 may be additionally connected to the second heavily doped region 52 of the active layer pattern 135, and a contact area of the second gate electrode pattern 177 and the active layer pattern 135 may be increased without a formation of an additional contact hole because the first gate electrode pattern 172 located in the third region 30 and a portion of the first gate electrode pattern 172 located in the fourth region 40 is in contact with the second gate electrode pattern 177. As a result, the OLED device may reduce a contact resistance of the second gate electrode pattern 177 and the active layer pattern 135.

Figure 21:
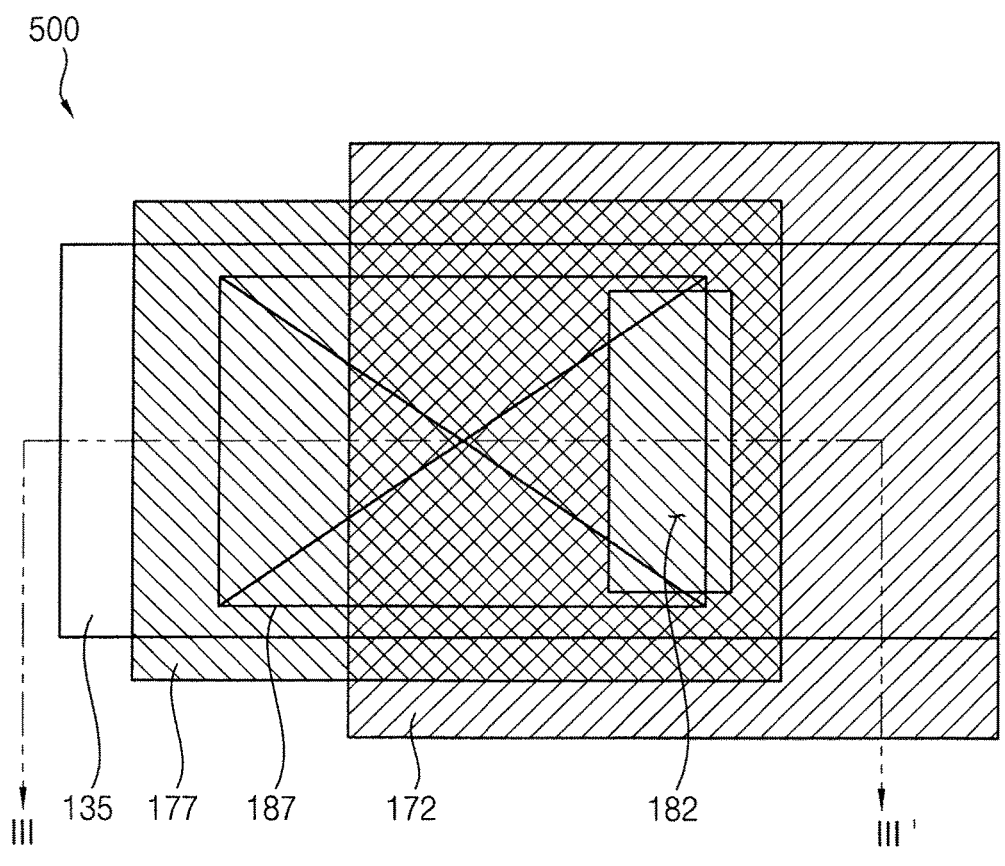
FIG. 21 is a layout diagram illustrating a wiring connection structure in accordance with some embodiments.
Figure 22:
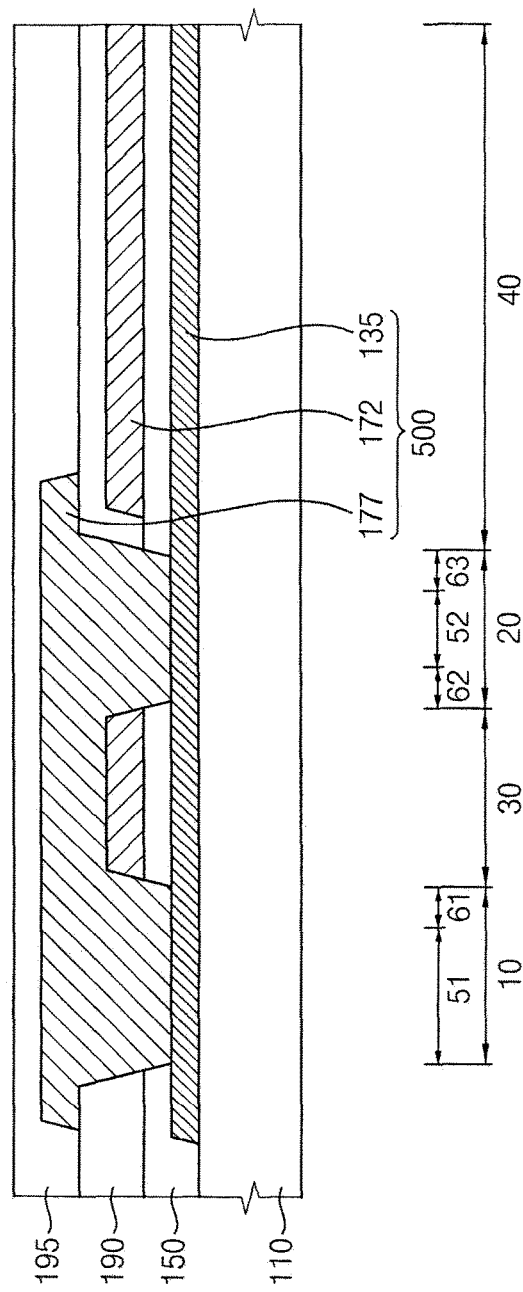
FIG. 22 is a cross-sectional view taken along the line III-III' of FIG. 21.

FIG. 21 is a layout diagram illustrating a wiring connection structure in accordance with some embodiments, and FIG. 22 is a cross-sectional view taken along the line III-III' of FIG. 21. A wiring connection structure 500 illustrated in FIGS. 21 and 22 may have a configuration substantially the same as or similar to that of a wiring connection structure 300 included in the OLED device 100 described with reference to FIGS. 1, 2, 3, 4 and 5 with the exception of a shape of a gate insulation layer 150, a shape of the first gate electrode pattern 172, a shape of a first insulating interlayer 190, and a shape of a second gate electrode pattern 177. In FIGS. 21 and 22, detailed descriptions for elements that are substantially the same as or similar to elements described with reference to FIGS. 1, 2, 3, 4 and 5 may not be repeated.

Referring to FIGS. 21 and 22, a wiring connection structure 500 may include an active layer pattern 135, a first gate electrode pattern 172, and a second gate electrode pattern 177.

The gate insulation layer 150 may be located on the substrate 110, the active layer 130, and the active layer pattern 135. In some embodiments, the gate insulation layer 150 may cover the active layer 130 on the substrate 110, and may extend in the first direction D1. In addition, the gate insulation layer 150 may expose the active layer pattern 135 in the first region 10 and in a portion of the second region 20. In addition, the gate insulation layer 150 may be located in the third lightly doped region 63 of the second region 20.

The first gate electrode pattern 172 may be located on the active layer pattern 135 and the gate insulation layer 150. In some embodiments, the first gate electrode pattern 172 may be located to overlap the active layer pattern 135 such that the first gate electrode pattern 172 exposes the first region 10 of the active layer pattern 135. In addition, the first gate electrode pattern 172 may have an opening that exposes a portion of the second region 20 of the active layer pattern 135. In other words, the first gate electrode pattern 172 may expose the second lightly doped region 62 of the second region 20 and an upper surface of the active layer pattern 135 located in the second heavily doped region 52 via the opening.

The first insulating interlayer 190 may be located on the gate insulation layer 150, the first gate electrode 170, and the first gate electrode pattern 172. In some embodiments, the first insulating interlayer 190 may cover the first gate electrode 170, and may extend in the first direction D1. In addition, the first insulating interlayer 190 may have a contact hole that overlaps the first region 10, a portion of the second region 20, and the third region 30. The contact hole may or may not overlap a portion of the fourth region 40. In other words, the first insulating interlayer 190 may expose an upper surface of the active layer pattern 135 in the first region 10, and may expose an upper surface of the second gate electrode pattern 177 in the third region 30. In addition, the first insulating interlayer 190 may expose an upper surface of the active layer pattern 135 in the second lightly doped region 62 and the second heavily doped region 52 that are included in the second region 20. In addition, the first insulating interlayer 190 may be located in the third lightly doped region 63 of the second region 20, and may cover the first gate electrode pattern 172 located in the fourth region 40.

The second gate electrode pattern 177 may be located on the first gate electrode pattern 172 and the first insulating interlayer 190. The second gate electrode pattern 177 may be in contact with the first gate electrode pattern 172 located in the third region 30, and may be connected to the active layer pattern 135 in the first region 10 and in a portion of the second region 20. In other words, the second gate electrode pattern 177 may be in contact with the first gate electrode pattern 172 located in the third region 30 via the contact hole of the first insulating interlayer 190, and may be connected to the active layer pattern 135 in the first region 10 and in a portion of the second region 20. Thus, the second gate electrode pattern 177 may be connected to the first heavily doped region 51 and the first lightly doped region 61 that are included in the first region 10, and may be connected to the second lightly doped region 62 and the second heavily doped region 52 that are included in the second region 20. As the second gate electrode pattern 177 is in direct contact with the first gate electrode pattern 172, and with the active layer pattern 135 in the first region 10 and in a portion of the second region 20, through the contact hole of the first insulating interlayer 190, a gate signal applied to the active layer pattern 135 may be provided to the first gate electrode pattern 172, and the gate signal may be applied to the first gate electrode 170 through the first gate electrode pattern 172 that is electrically connected to the first gate electrode 170.

Accordingly, as compared to FIGS. 1, 2, 3, 4, and 5, by extending the contact hole of the first insulating interlayer 190 in the first direction D1, the second gate electrode pattern 177 may be additionally connected to the second heavily doped region 52 of the active layer pattern 135 without contacting the third lightly doped region 63 of the second region 20, and a contact area of the second gate electrode pattern 177 and the active layer pattern 135 may be increased without an additional a contact hole because the first gate electrode pattern 172 located in the third region 30 is in contact with the second gate electrode pattern 177. As a result, the OLED device may reduce a contact resistance of the second gate electrode pattern 177 and the active layer pattern 135.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

The foregoing is illustrative of some embodiments and is not to be construed as limiting thereof. Although a few some embodiments have been described, those skilled in the art will readily appreciate that many modifications are possible in the some embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various some embodiments and is not to be construed as limited to the specific some embodiments disclosed, and that modifications to the disclosed some embodiments, as well as other some embodiments, are intended to be included within the scope of the appended claims and their functional equivalents.

What is claimed is:

1. An organic light emitting display (OLED) device, comprising:
   a substrate;
   a semiconductor element on the substrate, the semiconductor element comprising:
      an active layer;
      a first gate electrode on the active layer;
      a second gate electrode on the first gate electrode such that the first gate electrode is between the active layer and the second gate electrode; and
      source and drain electrodes above the second gate electrode;
   a wiring connection structure electrically connected to the semiconductor element, the wiring connection structure comprising:
      an active layer pattern spaced from the active layer on the substrate, the active layer pattern corresponding to a first region, a second region spaced from the first region, a third region between the first region and the second region, and a fourth region;
      a first gate electrode pattern overlapping the active layer pattern to expose the active layer pattern at the first region, and defining an opening that exposes the active layer pattern at the second region; and a second gate electrode pattern simultaneously contacting both upper and side surfaces of the first gate electrode pattern in the third region and the active layer pattern in the first region, and a sub-pixel structure on the semiconductor element and the wiring connection structure, wherein the first gate electrode pattern is between the active layer pattern and the second gate electrode pattern.

2. The OLED device of claim 1, wherein the semiconductor element further comprises:

a gate insulation layer on the substrate, the active layer, and the active layer pattern, and exposing the first region; and a first insulating interlayer on the gate insulation layer, the first gate electrode, and the first gate electrode pattern, and defining a contact hole overlapping the first region and the third region.

3. The OLED device of claim 2, wherein the first insulating interlayer contacts the gate insulation layer in the second region via the opening of the first gate electrode pattern.

4. The OLED device of claim 2, wherein the second gate electrode pattern contacts the first gate electrode pattern in the third region via the contact hole of the first insulating interlayer, and contacts the active layer pattern in the first region.

5. The OLED device of claim 2, wherein the first insulating interlayer covers the first gate electrode pattern in the fourth region.

6. The OLED device of claim 1, wherein the second gate electrode pattern extends in a direction from the first region into the fourth region, and fills the opening of the first gate electrode pattern, and wherein the second gate electrode pattern contacts the first gate electrode pattern in the third region and in the fourth region, and is connected to the active layer pattern in the second region.

7. The OLED device of claim 6, wherein the first region comprises a first heavily doped region and a first lightly doped region that is adjacent the third region, and wherein the second region comprises a second lightly doped region that is adjacent the first lightly doped region, a third lightly doped region that is spaced from the second lightly doped region, and a second heavily doped region that is between the second lightly doped region and the third lightly doped region.

8. The OLED device of claim 7, wherein the semiconductor element further comprises:

a gate insulation layer on the substrate, the active layer, and the active layer pattern, and exposing the active layer pattern at the first region and the second region; and a first insulating interlayer on the gate insulation layer, the first gate electrode, and the first gate electrode pattern, and defining a contact hole overlapping the first, second, third, and fourth regions.

9. The OLED device of claim 8, wherein the first insulating interlayer exposes a portion of the first gate electrode pattern at the fourth region.

10. The OLED device of claim 8, wherein the second gate electrode pattern contacts the first gate electrode pattern at the third region via the contact hole of the first insulating interlayer, and is connected to the active layer pattern at the first region and the second region.

11. The OLED device of claim 10, wherein the second gate electrode pattern is connected to the first heavily doped region, the first lightly doped region, the second lightly doped region, the second heavily doped region, and the third lightly doped region.

12. The OLED device of claim 7, wherein the semiconductor element further comprises:

a gate insulation layer on the substrate, the active layer, and the active layer pattern, and exposing the first region and a portion of the second region; and a first insulating interlayer on the gate insulation layer, the first gate electrode, and the first gate electrode pattern, and defining a contact hole overlapping the first region, the third region, and a portion of the second region.

13. The OLED device of claim 12, wherein the gate insulation layer and the first insulating interlayer are located above the third lightly doped region.

14. The OLED device of claim 12, wherein the second gate electrode pattern contacts the first gate electrode pattern at the third region via the contact hole of the first insulating interlayer, and is connected to the first heavily doped region, the first lightly doped region, the second lightly doped region, and the second heavily doped region.

15. The OLED device of claim 12, wherein the first insulating interlayer covers the first gate electrode pattern at the fourth region.

16. The OLED device of claim 1, wherein the semiconductor element further comprises a second insulating interlayer on the second gate electrode and the second gate electrode pattern.

17. The OLED device of claim 1, wherein the active layer pattern is configured to receive a gate signal, wherein the first gate electrode pattern is configured to receive the gate signal through the second gate electrode pattern, and wherein the first gate electrode is configured to receive the gate signal through the first gate electrode pattern.

18. The OLED device of claim 1, wherein the sub-pixel structure comprises:

a lower electrode on the semiconductor element;

a light emitting layer on the lower electrode; and an upper electrode on the light emitting layer.

19. The OLED device of claim 1, wherein an opening of the first gate electrode pattern has a first width extending a first direction, and a second width extending a second direction that is perpendicular to the first direction, wherein the first width is greater than 0.2 micrometers, and wherein the second width is greater than 0.5 micrometers.

20. The OLED device of claim 1, wherein the active layer and the active layer pattern comprise a same material, wherein the first gate electrode and the first gate electrode pattern comprises a same material, and wherein the second gate electrode and the second gate electrode pattern comprise a same material.

* * * * *